(12) United States Patent
Sul

(10) Patent No.: US 7,840,861 B2
(45) Date of Patent: Nov. 23, 2010

(54) SCAN-BASED TESTING OF DEVICES IMPLEMENTING A TEST CLOCK CONTROL STRUCTURE ("TCCS")

(75) Inventor: Chinsong Sul, Mountain View, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 605 days.

(21) Appl. No.: 11/476,457

(22) Filed: Jun. 27, 2006

(65) Prior Publication Data

US 2008/0010572 A1  Jan. 10, 2008

(51) Int. Cl.
   *G01R 31/28* (2006.01)
(52) U.S. Cl. .................. 714/726; 714/729; 714/731
(58) Field of Classification Search ............... 714/726, 714/727, 724, 729, 733, 731, 30, 738, 728, 714/730, 736, 725
   See application file for complete search history.

(56) References Cited

U.S. PATENT DOCUMENTS

| | | | |
|---|---|---|---|
| 4,860,290 A | | 8/1989 | Daniels et al. |
| 4,965,524 A | | 10/1990 | Patchen |
| 5,469,445 A | * | 11/1995 | Nicolaidis .................... 714/726 |
| 5,477,548 A | * | 12/1995 | Beenker et al. ............. 714/727 |
| 5,546,408 A | * | 8/1996 | Keller .......................... 714/741 |
| 6,442,722 B1 | * | 8/2002 | Nadeau-Dostie et al. ... 714/731 |
| 6,539,491 B1 | | 3/2003 | Skergan et al. |
| 6,779,163 B2 | | 8/2004 | Bednar et al. |
| 6,836,856 B2 | * | 12/2004 | Blanton ........................ 714/25 |
| 7,038,505 B2 | | 5/2006 | Cole et al. |
| 7,266,742 B1 | | 9/2007 | Pandey |
| 7,293,210 B2 | * | 11/2007 | Gunda et al. ................ 714/726 |
| 2002/0120896 A1 | * | 8/2002 | Wang et al. .................. 714/731 |
| 2002/0147951 A1 | | 10/2002 | Nadeau-Dostie et al. |
| 2004/0163021 A1 | * | 8/2004 | Nadeau-Dostie ............ 714/726 |
| 2004/0268181 A1 | * | 12/2004 | Wang et al. .................... 714/30 |
| 2005/0240847 A1 | * | 10/2005 | Nadeau-Dostie et al. .... 714/726 |
| 2006/0064616 A1 | * | 3/2006 | Rajski et al. ................. 714/726 |

OTHER PUBLICATIONS

EP Patent Application 07252569.4 Search Report Mailed Oct. 19, 2007 for 8029P009EP, (Oct. 19, 2007), 8 pages.
EP Application 07252561.1 search report mailed Oct. 19, 2007 for 8029P013EP, (Oct. 19, 2007).
USPTO, "8029P009 OA Mailed Oct. 29, 2008 for U.S. Appl. No. 11/477,049", (Oct. 29, 2008), Whole Document.
USPTO, "8029P009 FOA Mailed May 8, 2009 for U.S. Appl. No. 11/477,049", (May 8, 2009), Whole Document.
Non-Final Office Action mailed Oct. 27, 2009 for U.S. Appl. No. 11/477,049.

* cited by examiner

*Primary Examiner*—Jeffrey A Gaffin
*Assistant Examiner*—Daniel F McMahon
(74) *Attorney, Agent, or Firm*—Blakely Sokoloff Taylor & Zafman

(57) ABSTRACT

Methods and computer readable media for performing scan-based testing of circuits using one or more test clock control structures are disclosed. In one embodiment, a method includes performing an intra-domain test to exercise a first subset of domains of the plurality of circuits implementing dynamic fault detection test patterns. It also includes performing an inter-domain test to exercise a second subset of domains of the plurality of circuits implementing dynamic fault detection test patterns. The dynamic fault detection test patterns can include, for example, last-shift-launch test patterns and broadside test patterns. In various embodiments, the method can include configuring different programmable test clock controllers to test different domains substantially in parallel.

23 Claims, 26 Drawing Sheets

| SeD | SeC | State |
|---|---|---|
| 0 | 0 | Silent |
| 0 | 1 | Launch/Capture |
| 1 | 0 | Scan load/unload |
| 1 | 1 | Control load/unload |

FIG. 11

State diagram of SR for launch/capture

Example of a Test Procedure (for Programmable test clock)    2600

1. TM = 1;    2601     /* Enable scan test mode */

2. SeData= 1; SeClk = 1;    2602    /* Control load/unload for scan */

3. Load CPC = [ 11 |    2604    /* Enable scan clock (SCLK) */
                00 ];        /* Disable scan clock */

4. SeClk = 0;    2606    /* Scan path enabled */

5. Scan load/unload;    2608

6. SeClk = 1;    2610    /* Control load/unload for launch/capture */

7. Load CPC =
          [ 11 |     /* launch/capture */
  2612     10 |     /* launch-only*/
            01 |     /* capture-only*/
                00 ]:    /* Disable launch/catpure clock */

8. SeClk = 0; SeData = 0;    2614    /* Silent state */

9. Force Input;    2616    /* If Input is applied from ATE */

10. Measure output;    2618    /* If output is measured at ATE */

11. SeClk = 1;    2620    /* launch and capture */

/* Execution of programmed launch or/and capture carried out by PTCC */

12. SeData = 1;    2622

13. Until all clock domains are tested, go to    2624

Step 7, if launch/capture is continued without restoring scan data;

Step 3, if scan data in the exercised domain is restored;

14. Go to step 3 until all patterns are tested;    2630

15. End

FIG. 26

Proposed ATPG flow

2700

1. Generate delay test patterns for intra-clock domain logic — 2710
   a. Generate test patterns for delay faults using last-shift-launch — 2720
      i. In each pattern, embed an inter-clock domain test pattern — 2722
   b. Generate test patterns for undetected faults in step 1.a using broad-aside — 2730
      i. In each pattern, embed an inter-clock domain test pattern — 2732
2. Generate remaining delay test patterns for inter-clock domain logic — 2740
   a. Generate test patterns for delay faults using last-shift-launch — 2750
      i. In each pattern, embed stuck-at pattern for intra-clock logic — 2752
   b. Generate test patterns for undetected faults in step 2.a using broad-aside — 2760
      i. In each pattern, embed stuck-at pattern for intra-clock logic — 2762
3. Fault-simulate test patterns from steps 1 & 2 for stuck-at faults — 2780
4. Generate test patterns for undetected stuck-at faults in step 3 — 2790
   a. Generate test patterns for intra-clock domain logic — 2792
   b. Generate test patterns for inter-clock domain logic — 2794
5. Append stuck-at test pattern in step 4.a to resulted delay test patterns in step 1.a — 2796
6. Append stuck-at test pattern in step 4.b to resulted delay test patterns in step 2.a — 2798
7. Append the resulted broad aside test patterns to last-shift-launch to form final test patterns — 2799

SCAN-BASED TESTING OF DEVICES IMPLEMENTING A TEST CLOCK CONTROL STRUCTURE ("TCCS")

CROSS REFERENCE TO RELATED APPLICATIONS

This application is related to U.S. patent application Ser. No. 11/477,049 entitled "Test Clock Control Structures to Generate Configurable Test Clocks for Scan-Based Testing of Electronic Circuits Using Programmable Test Clock Controllers", concurrently filed on Jun. 27, 2006, and commonly owned by Silicon Image, Inc, the contents of which are incorporated herein by reference.

BRIEF DESCRIPTION OF THE INVENTION

This invention relates generally to testing of electronic devices, and more particularly, to methods and computer readable media for implementing scan-based testing using an architecture including one or more test clock control structures.

BACKGROUND OF THE INVENTION

Electronic device manufacturers use nanometer-level semiconductor fabrication processes to manufacture integrated circuits with reduced geometries sizes, thereby providing more transistors and interconnection resources per unit area. But manufacturing devices in increasingly smaller geometries also increases the presence of conductor-related failures and resistive-type defects. Conductor-related failures generally arise from process variations that degrade the quality of metallic interconnects, resulting in inconsistent contact resistances, for example. Resistive defects cause signal transitions to rise and fall more slowly at affected circuit nodes. But since traditional stuck-at and parametric leakage current (e.g., IDDQ test) test methods cannot effectively detect these types of faults, electronic device manufactures commonly rely on delay testing methodologies to screen out such failure modes. Structural delay tests, however, are noticeably more expensive than traditional test approaches, such as the stuck-at test. For example, the volume of data to implement delay tests is significantly greater than the volume of data for traditional stuck-at tests. In some cases, delay tests require three to five times more data than the stuck-at tests. Further, stuck-at tests detect static faults, such as a circuit node being "stuck at" a logic value of either 1 or 0. By comparison, delay tests detect dynamic faults that cause signals to either rise or fall more slowly than is acceptable. Generally, delay tests require propagation of a transitional signal through a circuit in which the test screens for delay-related faults. And since delay tests require the launch and the capture of the transition signal within certain timing constraints, delay test vectors are significantly more difficult to generate and synchronize with a test clock than stuck-at test vectors.

FIG. 1 is a diagram showing a portion 100 of a scan chain commonly used to implement conventional delay tests for detecting dynamic-related faults in a circuit under test ("CUT") 102. Conventional scan chains generally include flip-flops 108 and multiplexers 106. A scan enable ("SE") signal 104 controls multiplexers 106 either for exchanging stimulus and result signals with circuit 102, or for shifting scan data into or out of flip flops 108. Traditionally, scan enable 104 is a global signal that propagates from a single source through a fan-out arrangement, similar to test clock ("CLK") 120. Scan in terminal ("SI") 110 accepts scan data from an external source, such as automatic test equipment ("ATE"), whereas scan out terminal ("SO") 112 shifts out the results generated by the stimulus signals. To orchestrate a delay test using scan chain portion 100, test clock generators usually generate a test clock ("CLK") 120 to drive the scan data through a scan chain. A multiplexer 130 gates either a slow clock 140 or a fast clock 150. Specifically, scan chain portion 100 uses slow clock 140 for driving scan data through the scan chain, and uses fast clock 150 for performing at-speed functional test on circuit 102. While ATEs can operate as test clock generators, on-chip functional clock circuits, such as on-chip phase-locked loop ("PLL") circuits, can offer high-speed test clock signals at lower costs. But conventional test clock generation circuits are complicated and costly, especially when a device under test ("DUT") contains many clock domains, such as 20 to 100 clock domains, or more.

FIG. 2 illustrates the timing uncertainties arising from the use a single scan enable ("SE") signal to perform traditional at-speed delay tests in conventional scan chain structures. One example of an at-speed delay test commonly used for detecting dynamic faults is the "last-shift-launch" test. In this technique, the last scan data bit shifted into a scan chain for a first test pattern becomes an input of a second test pattern after one more shift. Timing diagram 200 shows test clock 120 and scan enable 104 signals of FIG. 1 performing a traditional last-shift-launch test. In particular, the first test pattern is shifted into a scan chain using slow clock 140 during scan mode, with the last scan data bit shifted into the scan chain as launch edge 210. To perform the at-speed delay test, scan enable 104 changes state along with the application of fast clock 150 to the scan chain to capture the functional test result. A drawback to using single scan enable signal 104 for implementing at-speed delay tests is that the detection of capture edge 220 must be within a defined interval of time, thereby imposing an at-speed timing constraint 202. Therefore, scan enable 104 must transition from one state to the next during at-speed timing constraint 202 to adequately detect capture edge 220. But it becomes difficult to expect scan enable 104 to adequately transition states as at-speed timing constraint 202 increasingly narrows to accommodate delay tests on smaller geometries.

FIG. 3 illustrates a typical scan chain structure 300 using conventional test clock control techniques to effect at-speed delay tests. As shown, scan chain structure 300 includes scan chain 320 having a scan input 310 and a scan output 312, as well as an internal clock generator 330 (e.g., one or more PLL circuits) and an internal test clock controller 340. Scan chain structure 300 uses internal test clock controller 340 to perform at-speed delay tests on circuits under test ("CUT") 302. Each circuit under test 302 resides in a clock domain 304. A clock domain is a region of circuitry that is synchronized with a particular clock. Clock control bits 350 define the operation of internal test clock controller 340. But to configure internal test clock controller 340, traditional at-speed test techniques embed clock control bits 350 into a scan chain 320 along with scan data bits. A drawback to this approach is that scan chain 320 is loaded with clock control bits 350 to test one clock domain 304 per scan chain loading. Thus, the entire scan chain 320 is loaded and unloaded every time a separate domain 304 is tested. Note, too, that clock control bits 350 are static, especially during testing. Specifically, scan chain structure 300 generally requires clock control bits 350 to remain immobile in scan chain 320 so that internal test clock controller 340 can operate according to those bits. As such, scan chain structure 300 and other similar conventional scan chain structures are not well-suited to operate internal test clock controller 340 independent of the bits in scan chain 320, especially when implementing inter-clock domain tests (e.g., launch and capture). Another drawback is that traditional scan chain structure 300 is generally inadequate to support control sequences and/or programs that control the selective loading and unloading of portions of scan chain 320 for purposes of reducing test time and data volume. For example, most scan chains 320 cannot selectively reload scan chain 320 (or one or more portions thereof) to test only targeted circuits under test 302. This means that scan chain 320 is likely loaded with data that is non-essential to a particular test, whereby the non-essential data loaded into scan chain 320 increases test data volume, which, in turn, increases test time. To examine the results of one of targeted circuits 302, traditional scan chains 320—which tend to be relatively lengthy—requires shifting both non-essential data and resultant, the combination of which contributes to generally long test times. Yet another drawback to scan chain structure 300 is that inter-domain logic 306 is generally inadequate to sufficiently synchronize a capture clock pulse in one clock domain with a launch clock pulse from another clock domain, especially when both clock domains have different clock frequencies.

FIG. 4 illustrates the testing of inter-domain logic 306 using the scan chain structure 300 of FIG. 3 using conventional test clock control techniques. Typically, a transition from logic 0 to 1 (or vice versa) is launched from an output register ("OutReg") 402 in a first clock domain ("i") 410 to an input register ("InReg") 404 of a second clock domain ("j") 420. Clock ("CLK[i]") 412 drives the transition from output register 402 via inter-domain combinational logic 306 to input register 404, which operates at clock ("CLK[j]") 422 to latch the state of the transition. A desired launch edge 450 provides for synchronicity of a capture edge 470 to properly capture a test response. But consider that one clock period for clock 422 corresponds to five clock periods of clock 412. If a transition is launched from clock domain 410 in synchronization with clock edge 460 for clock 422 (in clock domain 420), as is normally done in conventional delay tests, then five clock periods can elapse before the test response is captured within clock domain 420. Thus, the unintended launch at edge 440 may not properly capture a test response at edge 470. Managing synchronization among clock domains in conventional scan chain structures becomes increasingly difficult as the number of participating clock domains increases. In addition, latency inherent in traditional internal test clock controllers can complicate inter-clock domain testing for similar reasons.

FIG. 5 is a block diagram 500 depicting an internal test clock controller 502 having a conventional test functional clock path 530 for implementing at-speed delay tests. Internal test clock controller 502 receives a functional clock ("PLL Clk") 510 and embedded clock control bits 504 to generate delayed capture pulses. Internal test clock controller 502 also includes a pulse counter 520 to count the edges of functional clock 510, and logic 522 to generate a test clock 550 in response to the values of embedded clock control bits 504. In operation, pulse counter 520 and logic 522 cooperate to delay a capture pulse 570 after a launch pulse 560 by a delay 562 to perform, for example, inter-domain testing. A drawback to this approach is that internal test clock controller 502 includes a test functional clock path 530, which includes additional circuit elements other than a multiplexer 534. These additional elements 536 can detrimentally skew at-speed functional clock signal 510 when performing launch and capture operations, resulting in uncertainty 580 in the timing of capture pulse 570. Usually, delay 562 requires clock balancing to guarantee that an at-speed functional clock over path 530 in test mode can mimic functional clock 510 in run mode (e.g., when test mode, or TM, is disabled) over path 532, which does not include additional elements 536.

FIGS. 6A and 6B depict traditional implementations for broadside and last-shift-launch test protocols, respectively. FIG. 6A includes a scan chain 610 including various registers stages 612. For broadside protocol testing as shown in diagram 600, a desired transition 602 is launched from a previous register stage 612b to propagate through a combinational circuit 620b, and then captured in register 630 in the register stage 612c. This tests—directly or indirectly—combination circuits 620a and 620b. During a launch edge, register 632 latches a logical 0, thereby launching a 1-to-0 transition through combinational circuit 620b. Register 630 captures the logical 0 value at a capture edge. Note that the presence of logical 0 depends on a prior transition 601 from the value in register 634, thereby testing combinational circuit 620a. In this technique, an entire scan chain is loaded with data by shifting it in at slow speeds in test mode, followed by the two at-speed clocks pulses (e.g., the launch and capture edges) in functional mode. Then once the values are captured, the data can be shifted out slowly in test mode. While a delay test using the broadside protocol can detect otherwise undetectable delay faults, the size of test patterns for broadside protocols is usually larger than pattern for last-shift-launch protocols. Further, the test patterns for broadside are sequential in nature and thus are more difficult to generate.

FIG. 6B includes a scan chain 660 including various registers stages 672. For last-shift-launch protocol testing, a transition 662 is launched from the last shift during a scan load or unload sequence in register stage 672b. It is then captured into register 680 in next register stage 672c. Since input transition 690 is launched from the last shift 661, pattern sizes for last-shift-launch tests can be smaller and easier to generate than that of broadside because sequential test patterns are more difficult to compress than combinational patterns. But the last-shift-launch protocol suffers from the drawbacks described above. Since both broadside and last-shift-launch both seemingly have mutually exclusive advantages and disadvantages, most designers implement either only one or the other.

In view of the foregoing, it would be desirable to provide systems, structures and methods that minimize the above-mentioned drawbacks and provide for at-speed scan-based testing to at least detect delay-related faults.

SUMMARY OF THE INVENTION

Methods and computer readable media for performing scan-based testing of circuits using one or more test clock control structures are disclosed. In one embodiment, a method includes performing an intra-domain test to exercise a first subset of domains of the plurality of circuits implementing dynamic fault detection test patterns. It also includes performing an inter-domain test to exercise a second subset of domains of the plurality of circuits implementing dynamic fault detection test patterns. The dynamic fault detection test patterns generally include, for example, last-shift-launch test patterns and broadside test patterns. In one instance, the domains are clock domains. As such, the method can include configuring different programmable test clock controllers to test different clock domains substantially in parallel. Note that in some cases, testing different clock domains substantially in parallel can include reducing the number of times one or more scan chains are loaded when testing the different clock domains. The method can include implementing static fault detection test patterns by, for example, loading the dynamic fault detection test patterns into scan chains substantially concurrent with the static fault detection test patterns, and executing a dynamic test using the dynamic fault detection test patterns substantially concurrent with static fault testing.

In one embodiment, the method can perform the intra-domain testing by, for example, loading intra-clock domain test patterns into scan chains substantially concurrent with inter-clock domain test patterns, and executing an intra-clock domain test and an inter-clock domain test during the intra-domain testing without reloading scan chains. In another embodiment, the method can also perform inter-domain testing by, for example, loading inter-clock domain test patterns into scan chains substantially concurrent with intra-clock domain test patterns, and executing an inter-clock domain test and an intra-clock domain test during the inter-domain testing without reloading scan chains. In some instances, inter-domain testing further includes performing intra-domain testing on portions of the plurality of circuits isolated from the inter-domain testing. Performing the inter-domain testing can further include implementing static fault detection test patterns by, for example, loading the dynamic fault detection test patterns into scan chains substantially concurrent with the static fault detection test patterns, and executing a dynamic test substantially concurrent with static fault testing during the inter-domain testing. The execution of the dynamic test can include executing either a last-shift-launch test or a broad side test, or both.

In another embodiment, a method includes configuring a first subset of programmable test clock controllers to load scan chains, loading scan data into the scan chains in accordance with clock command information specifying whether to enable loading of the scan chains, and configuring a programmable test clock controller in the first subset of programmable test clock controllers to generate test clocks in response to additional clock command information specifying whether to detect faults. It also can include generating the test clocks in accordance with the additional clock command information to test one or more circuits. In some instances, generating the test clocks further includes testing for either dynamic faults using a last-shift-launch test and a broadside test, or testing for static faults using a stuck-at test, or both. Generating the test clocks can further include generating a test clock for one of the programmable test clock controllers in parallel to other test clocks for other of the programmable test clock controllers, thereby testing multiple domains in parallel. Note that in some embodiments, the method further includes performing an additional operation using the scan data without loading the scan chains, which includes configuring at least one programmable test clock controller from the first subset of programmable test clock controllers to generate another test clock to perform another test of the one or more circuits.

In yet another embodiment, a computer readable medium is configured to implement a test clock control structure to effect scan-based testing of circuits. The computer readable medium includes executable instructions to generate a control layer clock signal (TCLK) to program programmable test clock controllers with clock command information to test circuits, generate a scan layer clock signal (SCLK) for driving some of the scan chains at a scan-speed, load scan chains associated with a first subset of the programmable test clock controllers, and generate test clocks. The executable instructions to generate test clocks thus can perform intra-domain tests to test a first subset of the circuits implementing one or more types of dynamic fault detection tests, perform inter-domain tests to test a second subset of the circuit implementing the one or more types of dynamic fault detection tests, and/or perform stuck-at tests for other circuits. The two or more of the intra-domain tests, the inter-domain tests, and the stuck-at tests can be performed substantially in parallel.

BRIEF DESCRIPTION OF THE FIGURES

The invention is more fully appreciated in connection with the following detailed description taken in conjunction with the accompanying drawings, in which:

FIG. 11 is a table illustrating the states of operation for a programmable test clock controller based on multiple scan enable control signals in accordance with an embodiment of the invention;

FIG. 26 shows an example of a micro-level flow for using test clock controller structures implementing programmable test clock controllers ("PTCCs") to test circuits in accordance with an embodiment of the present invention; and FIG. 27 shows an example of a macro-level flow for using test clock controller structures and programmable test clock controllers ("PTCCs") to test circuits in accordance with an embodiment of the present invention.

Like reference numerals refer to corresponding parts throughout the several views of the drawings. Note that most of the reference numerals include one or two left-most digits that generally identify the figure that first introduces that reference number.

DETAILED DESCRIPTION FOR EXAMPLES OF EMBODIMENTS

Figure 1:
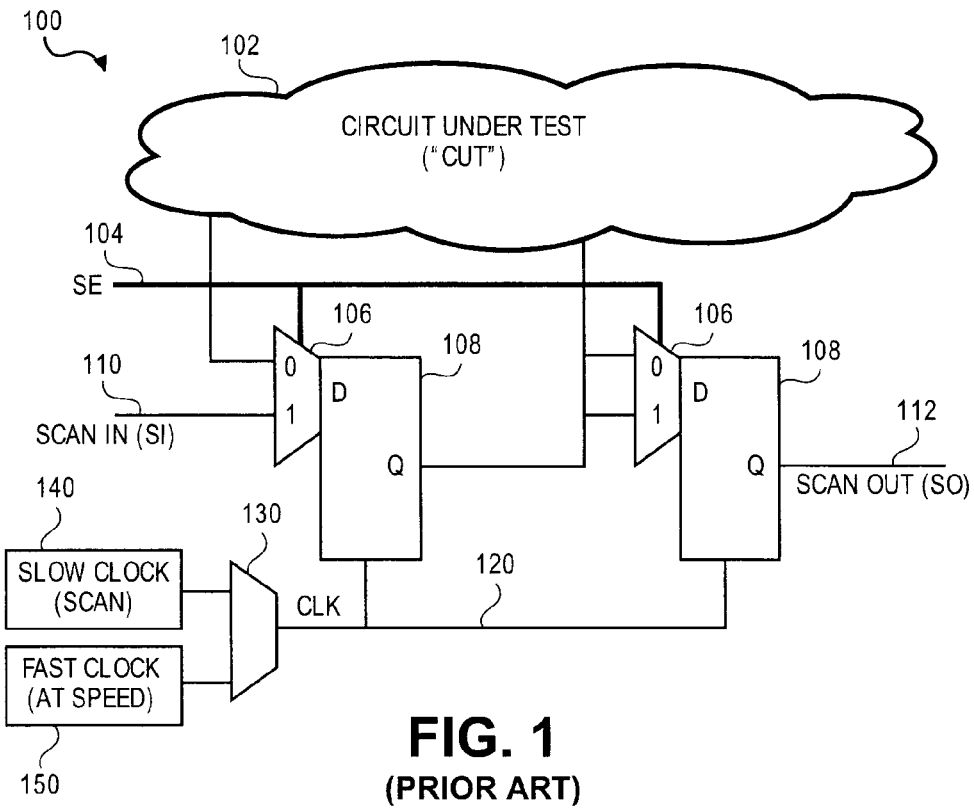
FIG. 1 is a diagram showing a portion of a scan chain commonly used to implement conventional delay tests for a circuit under test.
Figure 2:
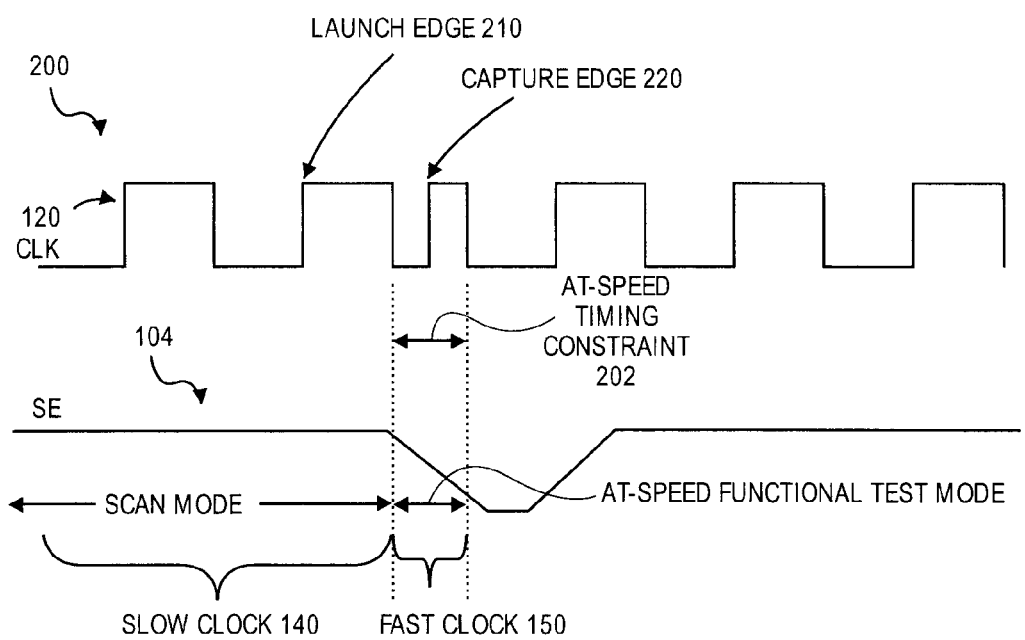
FIG. 2 illustrates the timing uncertainty of using a single scan enable ("SE") signal to perform an at-speed delay test in conventional scan chain structures.
Figure 3:
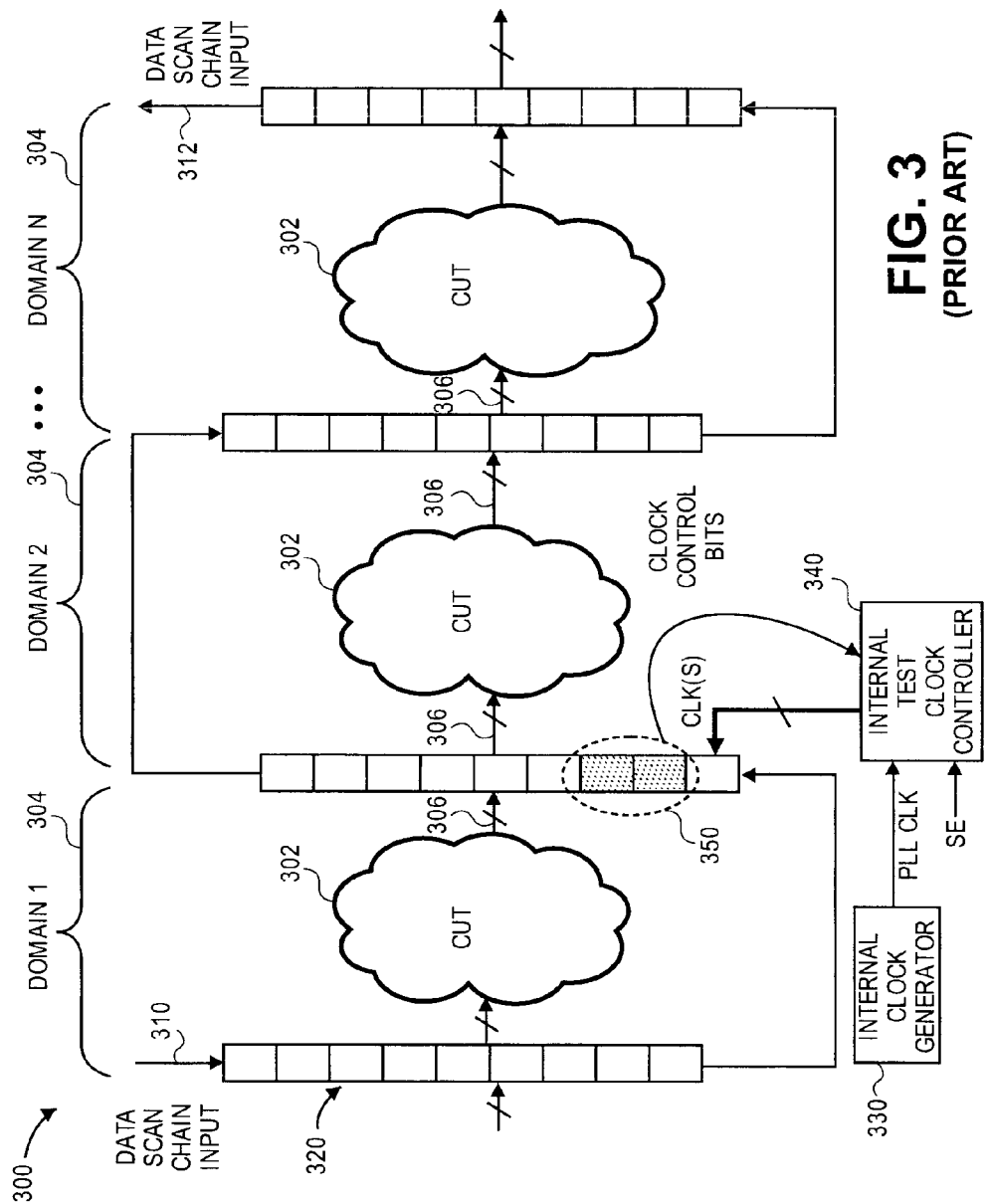
FIG. 3 illustrates a typical scan chain structure using conventional test clock control techniques to implement at-speed delay tests.
Figure 4:
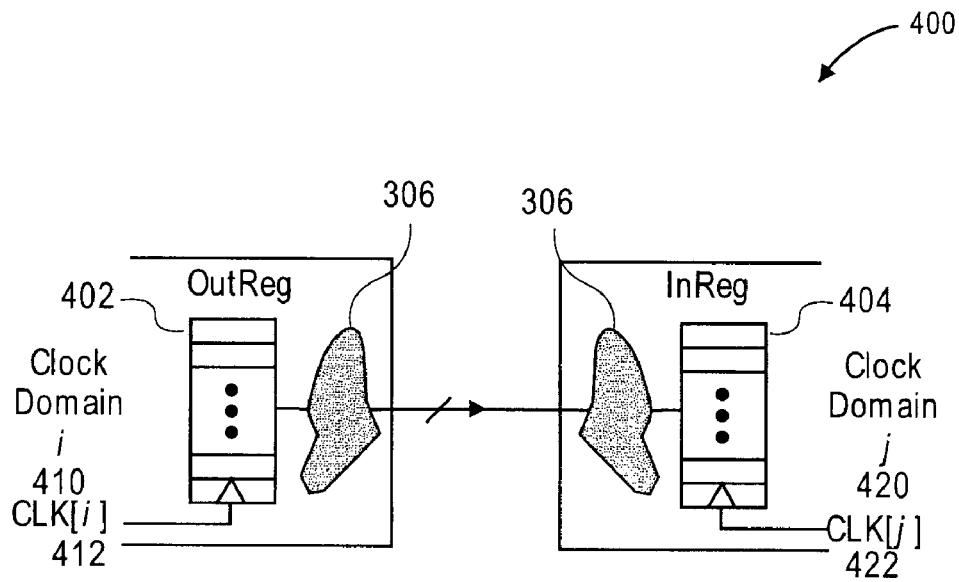
FIG. 4 illustrates the testing of inter-domain logic using the scan chain structure of FIG. 3.
Figure 4:
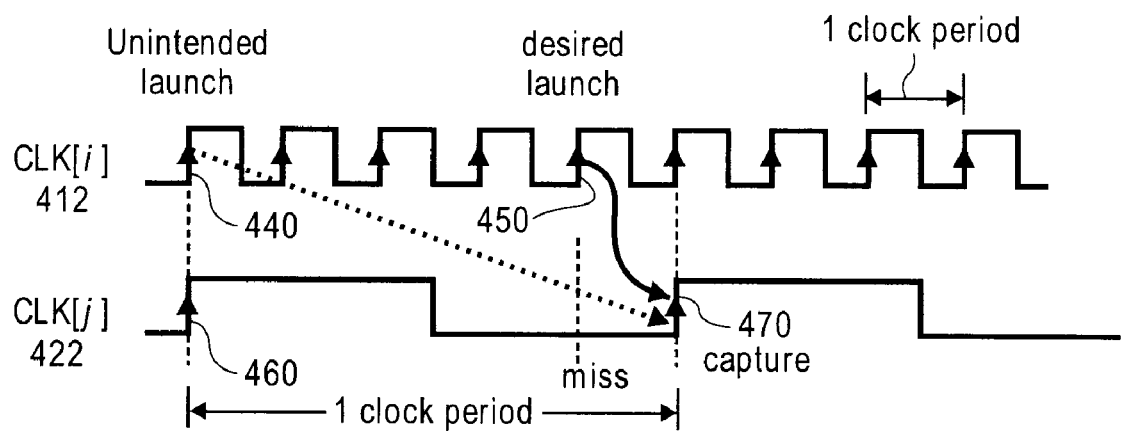
Figure 5:
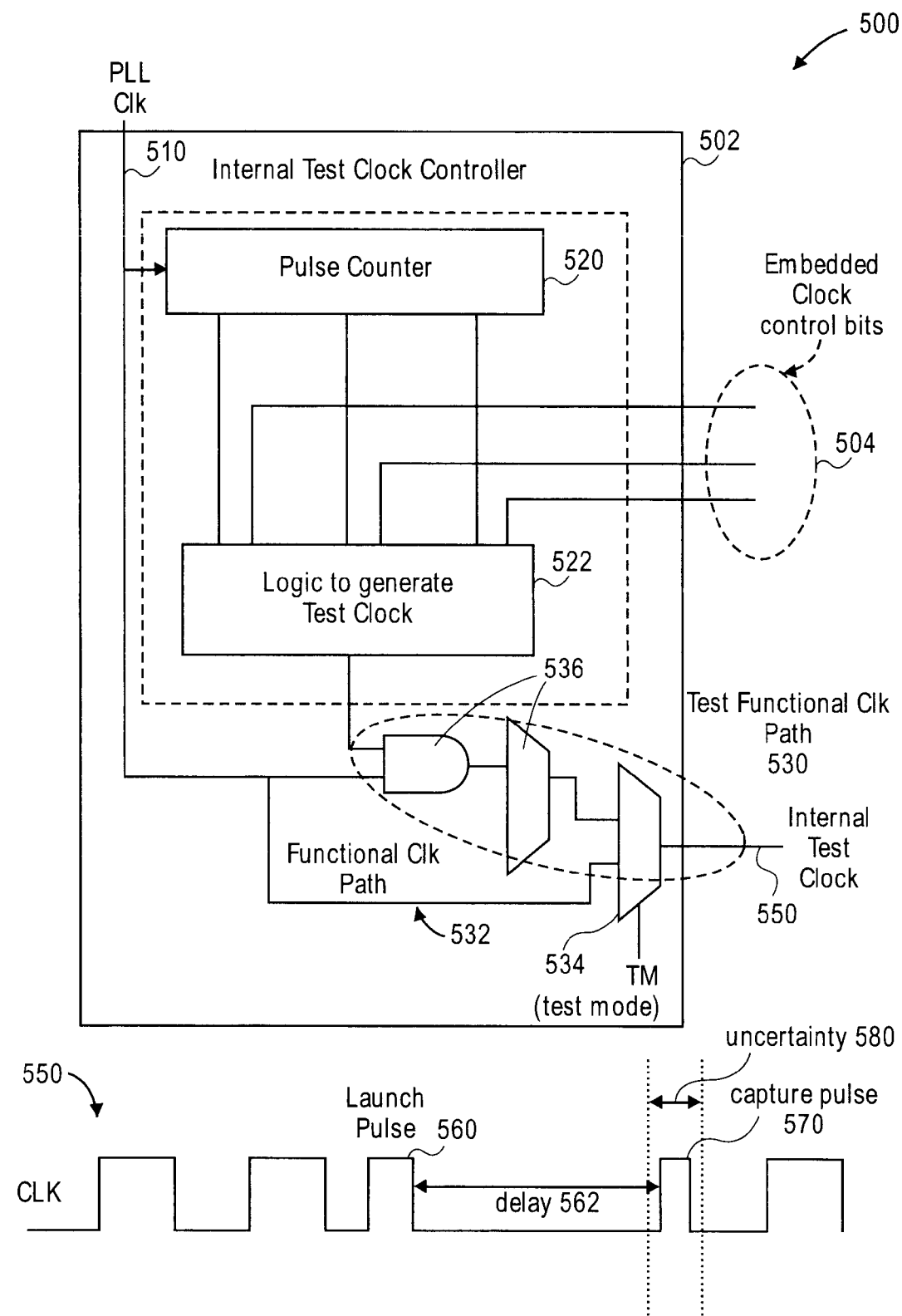
FIG. 5 is a block diagram depicting a conventional internal test clock controller having a test functional clock path that skews at-speed clock signals.
Figure 6A:
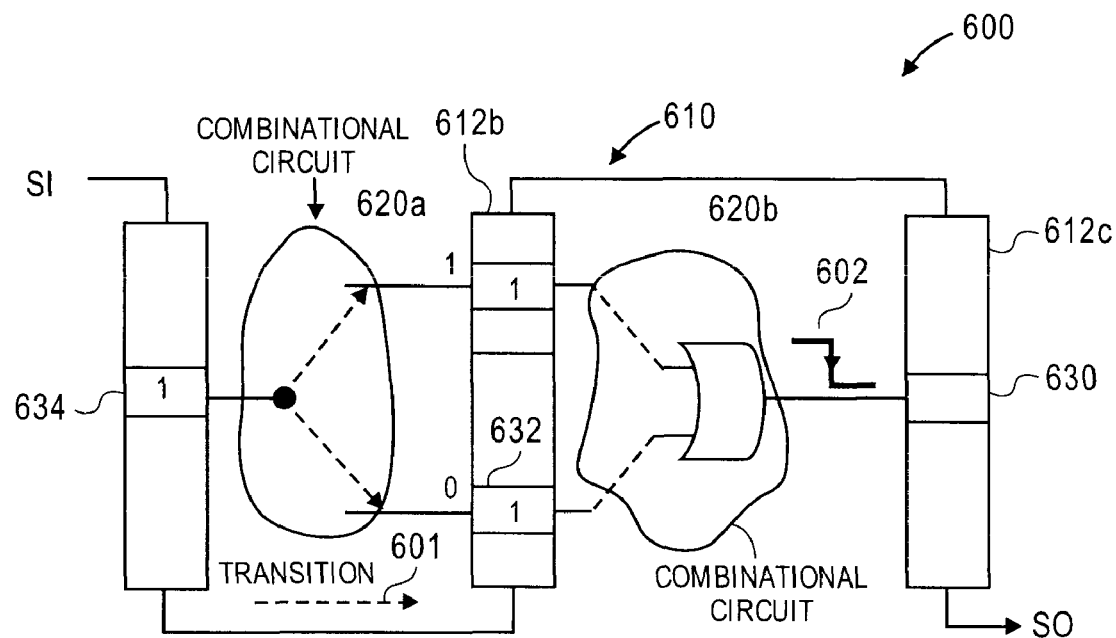
FIGS. 6A and 6B depict traditional implementations for broadside and last-shift-launch test protocols, respectively.
Figure 6B:
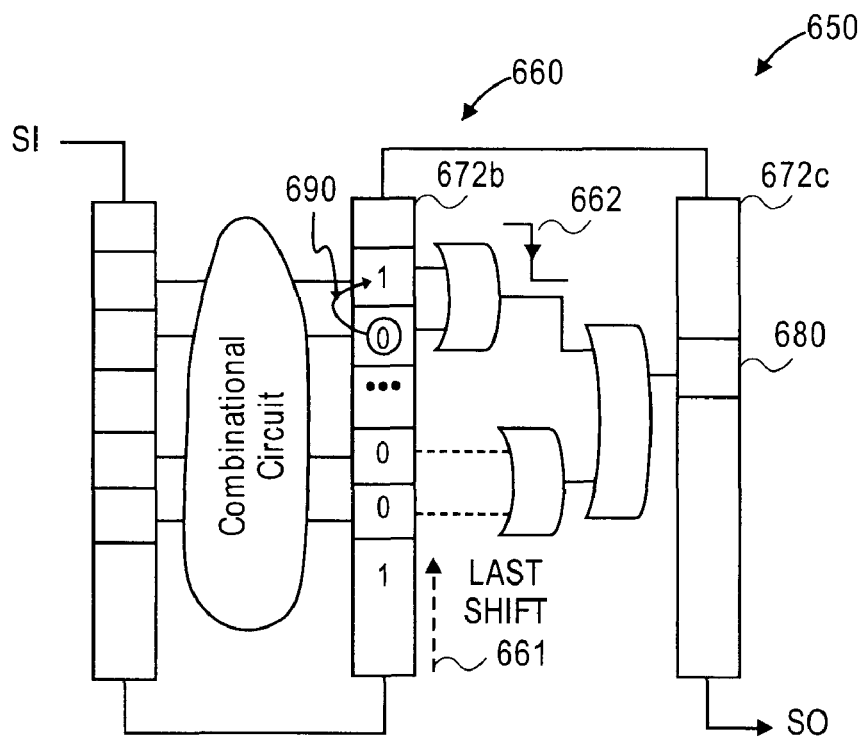
Figure 7:
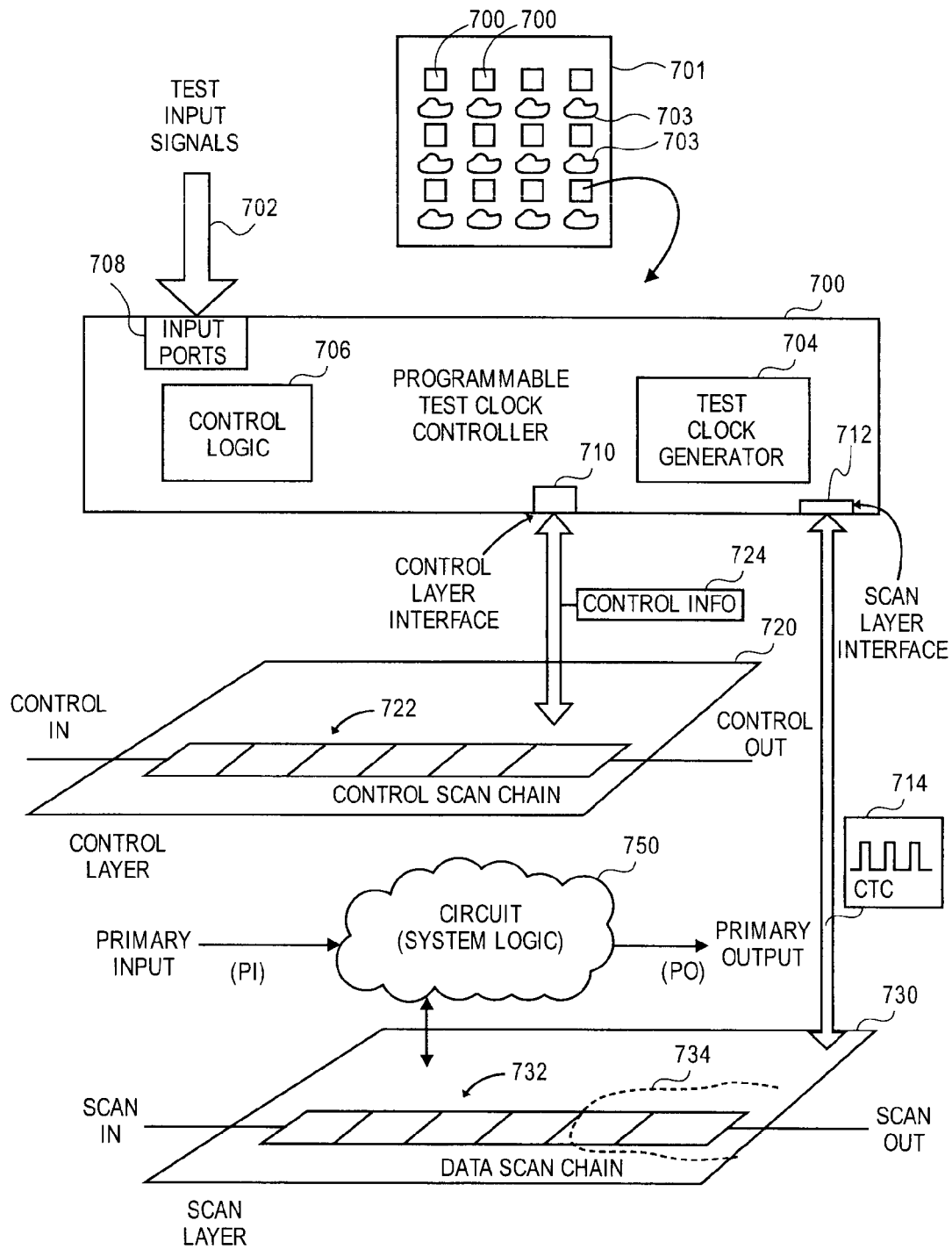
FIG. 7 is a block diagram illustrating a test clock control structure for testing a circuit, according to at least one specific embodiment of the invention.

FIG. 7 is a block diagram illustrating a test clock control structure for testing at least one circuit, according to one specific embodiment of the invention. Test clock control structure 701 includes one or more programmable test clock controllers 700 for testing circuits under test 703. As shown, programmable test clock controllers interact with data on two distinct layers: a control layer 720 and a scan layer 730. Programmable test clock controller 700 includes a test clock generator 704 for generating a configurable test clock ("CTC") 714. Programmable test clock controller 700 also can include a scan layer interface 712 to drive at least a scan chain portion of a scan chain 732 with configurable test clock 714 via scan layer interface 712. As shown, scan chain 732 lies in scan layer 730. Further, programmable test clock controller 700 can include a control layer interface 710 to access control information 724 for controlling, for example, scan chain 732 or scan chain portion 734.

Programmable test clock controller 700 can include control logic 706 that interfaces a portion of a control chain 722, for example, in control layer 720 via control layer interface 710. Control logic 706 thereby can control whether to selectably load scan data into scan chain 732 (or a portion thereof) based on control information 724. In various embodiments, control chain 722 is a different channel from the scan chain 734, thereby facilitating transport of control information 724 to programmable test clock controller 700 independent from the transport of the scan data. Advantageously, this reduces the quantity of scan load and unload sequences, thereby reducing test time. In some cases, control logic 706 can facilitate the implementation of two or more scan testing protocols to test circuit 750 using substantially the same data from the scan chain (e.g., without an entire loading or unloading of a scan chain between different test protocols). For example, programmable test clock controller 700 can provide for the use of broadside testing and last-shift-launch testing protocols during the same test flow. As programmable test clock controller 700 can accommodate different test protocols in a single framework, it can advantageously increase the test coverage in comparison to the implementation of a single delay test protocol. So if a fault is not detected using the last-shift-launch technique, for example, broadside testing can be implemented to detect the fault. In one embodiment, programmable test clock controller 700 includes input ports 708 to receive multiple scan enable control signals that collectively replace a conventional single scan enable signal. In another embodiment, test clock control structure 701 can be formed on a single substrate including circuit 750. Configurable test clock 714 can be referred to as a test clock as well as a chain clock. Generally, a test clock control structure includes programmable test clock controllers, control chains, scan chains, as well as other test-related structures for testing circuitry.

Figure 8:
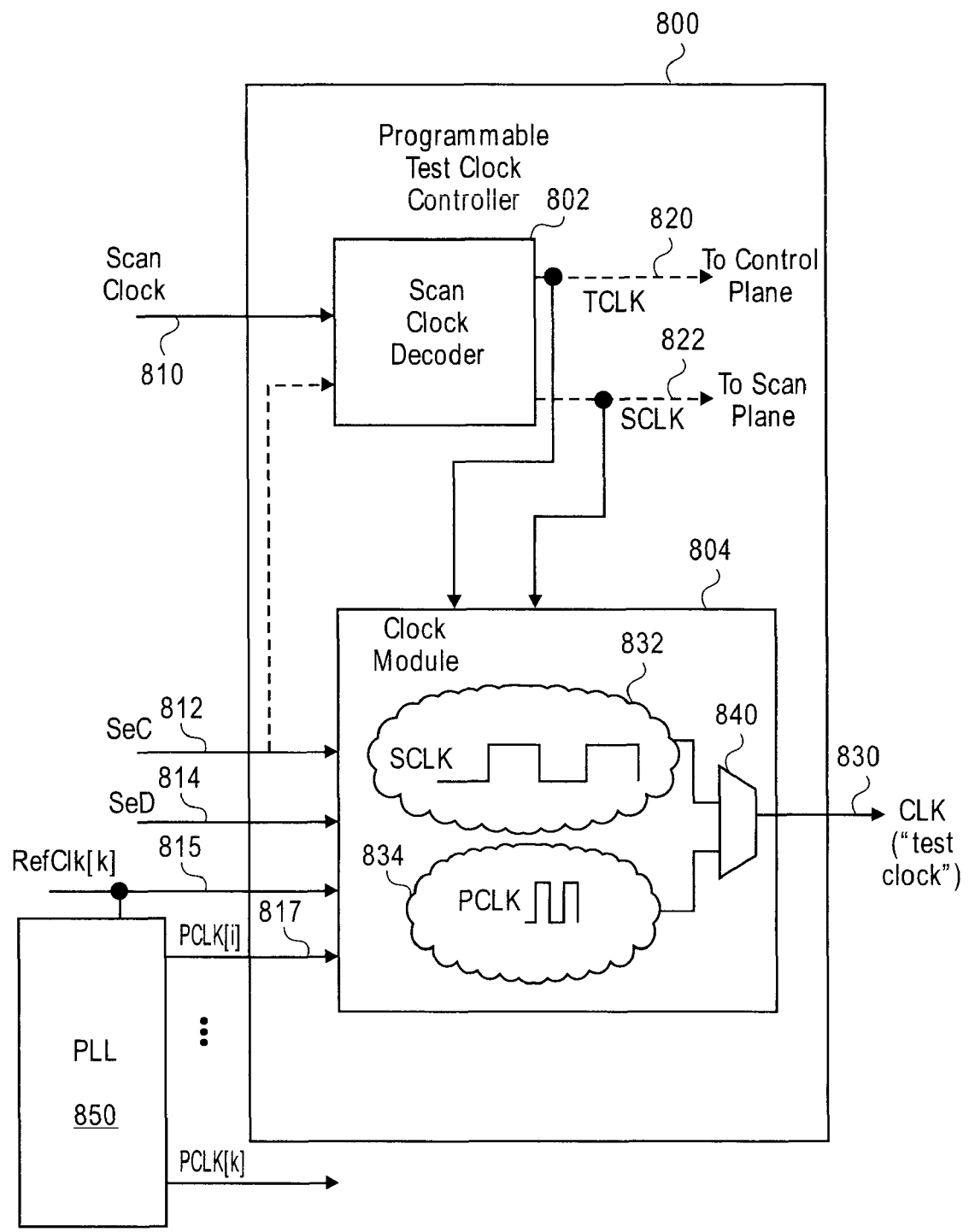
FIG. 8 is a block diagram illustrating a programmable test clock controller, according to at least one specific embodiment of the invention.

FIG. 8 is a block diagram illustrating a programmable test clock controller, according to at least one specific embodiment of the invention. Programmable test clock controller 800 is configured to generate configurable test clocks for structural delay tests using a relatively low-speed scan clock (i.e., at "scan speed") and a relatively high-speed functional clock (i.e., "at speed") to configure a test clock 830 to implement multiple delay test protocols. Programmable test clock controller 800 can configure a test clock to perform sequences of scan chain load and unload operations. Or, it can configure the test clock to launch an input transition and capture a test response. As such, programmable test clock controller 800 can configure test clock 830 as either a scan-speed clock ("SCLK") 832 to drive scan data into or out of a scan chain, or an at-speed functional clock ("PCLK") 834 to perform launch and/or capture operations. In at least one embodiment, a multiplexer 840 (or any equivalent structure capable of performing a multiplexing operation) routes either scan-speed clock 832 or at-speed functional clock 834 to an output terminal to provide test clock 830. Programmable test clock controller 800 can be inserted into virtually any functional clock path and can be integrated with any functional clock source, such as an on-chip PLL, without significantly modifying the internal clock structures. Further, programmable test clock controller 800 can be programmed to disable any clock domain, thereby selectably including and excluding one or more clock domains from any launch, capture, scan load and scan unload operation.

Programmable test clock controller 800 includes a scan clock decoder 802 and a clock module 804 to generate a configurable test clock, such as test clock ("CLK") 830, from a functional clock PCLK[i] 817 and an externally-driven scan-speed scan clock ("Scan Clock") 810. In some cases, a PLL circuit 850 generates the functional clock 834 and an ATE generates scan clock 810. A reference clock ("RefClk[k]") 815 can be provided to PLL 850 to generate functional clock 817, and can control operation of, for example, clock module 804. In some embodiments, at-speed functional clock 834 is essentially functional clock 817. Scan clock decoder 802 decodes scan clock 810 to synthesize clock control signals, including a control layer clock signal ("TCLK") 820 and a scan layer clock signal ("SCLK") 822. Control layer clock signal 820 is used to at least supply clock command information from a control chain (not shown) to clock module 804. Scan layer clock signal ("SCLK") 822 is used to drive a scan chain, or a portion thereof (not shown). Note that control layer clock signal 820 and scan layer clock signal 822 can be conceptual in nature and need not extend beyond programmable test clock controller 800.

While traditional scan test clock control techniques use a single scan enable ("SE") signal to multiplex between a scan path and functional path, programmable test clock controller 800 replaces the conventional single scan enable signal with at least two scan enable control signals: Scan enable Clock ("SeC") control signal 812 and scan enable data ("SeD") control signal 814. SeD control signal 814 is configured to multiplex between the functional path and scan path, whereas SeC control signal 812 multiplexes between a scan clock and a functional (i.e., at-speed) clock. Advantageously, the separation of clock and data control simplifies the design for clock generation structures and eases synchronization from scan shift to launch and capture operations and vise versa. Further, separate SeD clock control signal 814 and SeC data control signal 812 also provide the ability for programmable test clock controller 800 to implement different test protocols, such as broadside and last-shift-launch, on the same chip.

Figure 9:
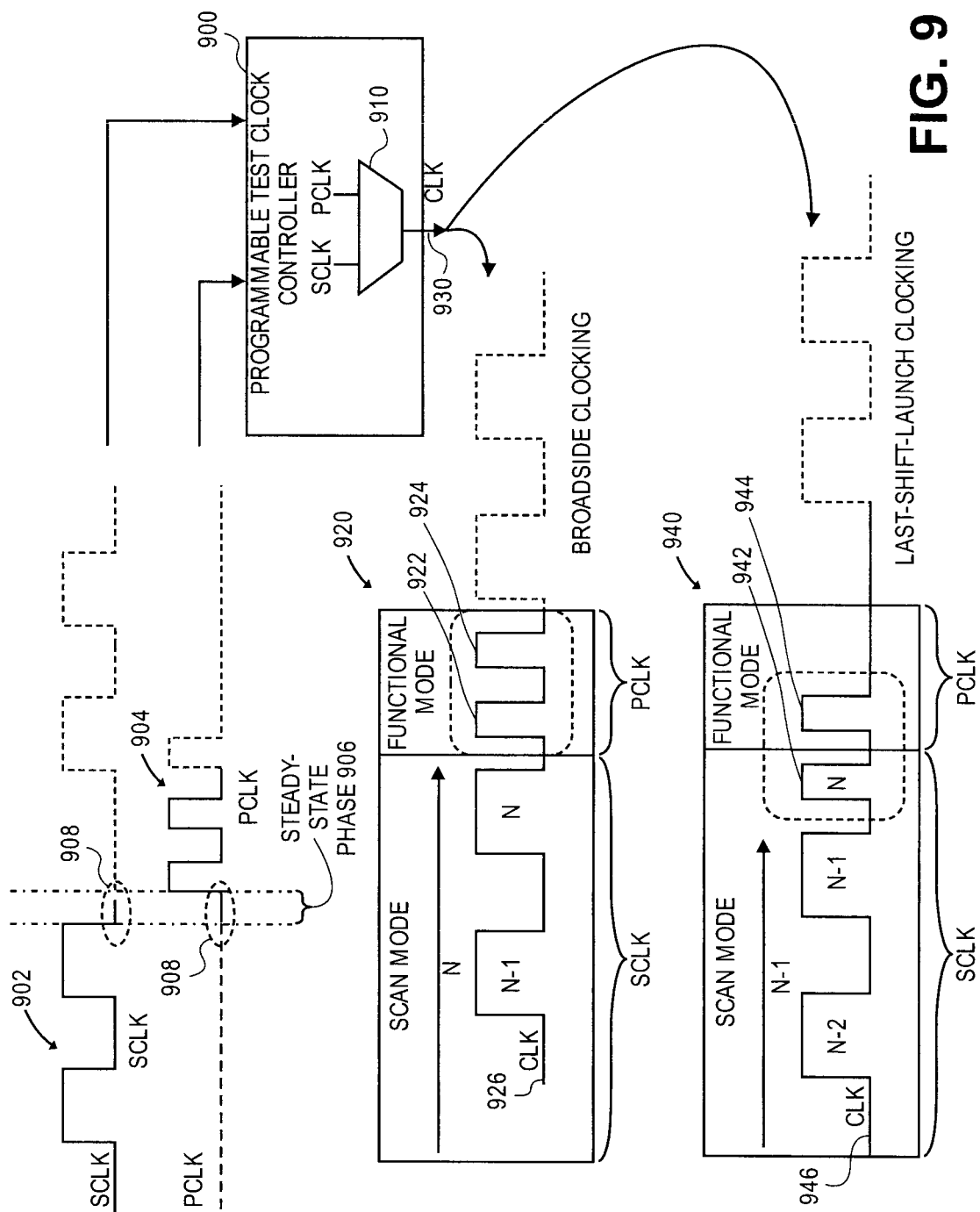
FIG. 9 is a diagram illustrating an example of one function of a programmable test clock controller in accordance with an embodiment of the invention.

FIG. 9 is a diagram illustrating examples of the functions performed by a programmable test clock controller in accordance with an embodiment of the invention. Programmable test clock controller 900 is configured to multiplex a relatively low-speed scan clock ("SCLK") 902 and a relatively high-speed functional clock ("PCLK") 904 to generate a test clock 930 to implement at least broadside and last-shift-launch delay test protocols. In particular, programmable test clock controller 900 multiplexes between clock sources during substantially steady-state portions 908 of scan clock 902 and functional clock 904. By multiplexing between clock sources having the same steady-state value (e.g., logical low) in a steady-state phase 906, programmable test clock controller 900 provides for safe switching between scan clock 902 and functional clock 904 so that, for example, the duty cycles remain unaltered and glitches are minimized. In one embodiment, programmable test clock controller 900 uses a multiplexer 910 to multiplex between scan clock 902 and functional clock 904 without requiring additional logic elements in the at-speed clock generation path. As such, programmable test clock controller 900 can avoid clock skew common to some conventional test clock generators that use additional logic elements for clock gating purposes. Programmable test clock controller 900 can configure test clock 930 as either clock 926 to provide for broadside clocking or clock 946 to provide for last-shift-launch clocking. As such, programmable test clock controller 900 can advantageously implement both broadside and last-shift-launch protocols. To implement broadside clocking 920, programmable test clock controller 900 operates to shift N scan data bits into a scan chain during scan mode, after which it provides a launch clock edge 922 and a capture clock edge 924, both at speed, during a functional mode. To implement last-shift-launch clocking 940, programmable test clock controller 900 operates to shift N−1 scan data bits during scan mode. After the Nth−1 bit, it provides a launch clock edge 942 as an Nth clock edge in scan mode, after which a capture clock edge 944 follows as the Nth+1 clock capture clock edge during the functional mode.

Figure 10:
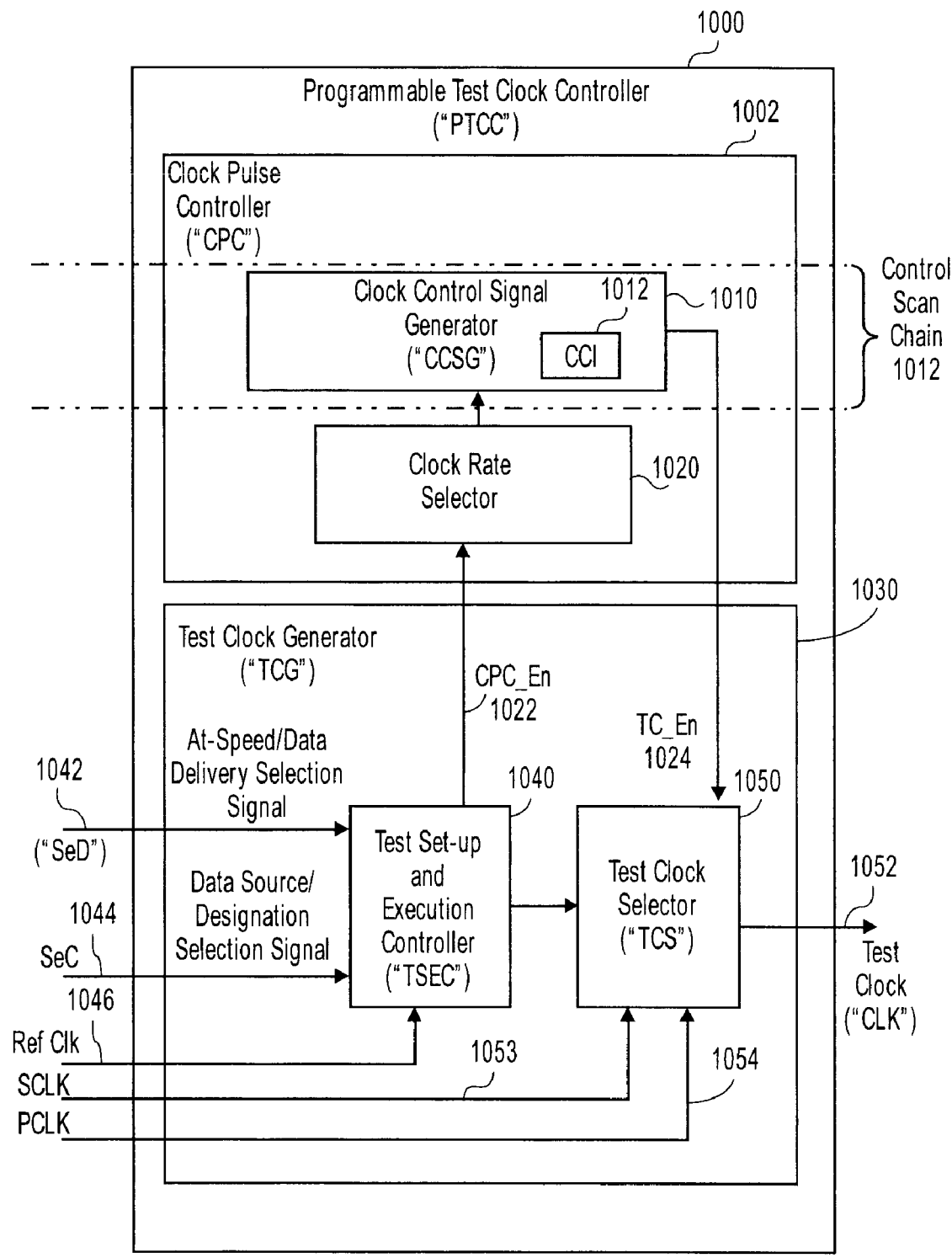
FIG. 10 is a diagram illustrating an example of a programmable test clock controller in accordance with an embodiment of the invention.

FIG. 10 is a diagram illustrating an example of a programmable test clock controller in accordance with an embodiment of the invention. Programmable test clock controller 1000 includes a clock pulse controller ("CPC") 1002 configured to generate a clock control signal ("TC_En") 1024 in accordance with clock command information ("CCI") 1012 programmed into clock pulse controller 1002. Clock pulse controller 1002 can form a portion of a control chain 1012 in a control layer. Programmable test clock controller 1000 also includes a test clock generator 1030 configured to generate a test clock ("CLK") 1052 as a function of a portion of clock command information 1012. In some cases, clock command information 1012 specifies whether to apply a functional clock signal as test clock 1052 to a scan chain. Programmable test clock controller 1000 receives a reference clock ("Ref Clk") 1046, which can be input to a PLL circuit. The phase of reference clock 1046 can be locked to one or more PLL output clocks from the one or more PLL circuits.

In one embodiment, clock pulse controller 1002 includes a clock control signal generator 1010 and a clock rate selector 1020. Clock control signal generator 1010 generates a clock control signal 1024 at each clock edge based on clock command information 1012, whereas clock rate selector 1020 sets a clock cycle period for each of the individual clock edges. Clock rate selector 1020 selects between a first period indicative of a first clock rate for at-speed testing and a second period indicative of a second clock rate for at least driving the scan chain. Test clock generator 1030 can include a test set-up and execution controller 1040 and a test clock selector 1050. Test set-up and execution controller 1040 operates to configure programmable test clock controller 1000 in either a data delivery mode or a test execution mode. In addition, test set-up and execution controller 1040 provides a clock rate control signal ("CPC_En") 1022 to select the clock rate at which individual clock edges, for example, are shifted out as test clock 1052. Test clock selector 1050 is configured to apply either a functional clock signal 1054 or a subset of individual clock edges based on clock control signal 1024 to the scan chain. Note that clock control signal 1024 can specify a programmable amount of individual clock edges for functional clock signal 1054 that form test clock 1052. In at least one embodiment, test clock selector 1050 also provides a scan clock ("SCLK") 1052 as test clock 1052 for shifting scan data in and out of the scan chain. According to one embodiment, test clock generator 1030 includes at least two inputs. A first input is configured to receive a scan enable data ("SeD") signal 1042 indicative of operating programmable test clock controller 1000 in either the data delivery mode or the test execution mode, whereas a second input is configured to receive a scan enable clock ("SeC") signal 1044 indicative of configuring programmable test clock controller 1000 to either apply functional clock signal ("PCLK") 1054 or a subset of the individual clock edges to the scan chain. Programmable test clock controller 1000 operates to shift data into either the scan chain or the control chain using a scan-speed clock rate, if scan enable data signal 1042 represents the data delivery mode. Or, it operates to configure itself to perform functional tests using an at-speed clock rate, if scan enable data signal 1042 represents the test execution mode. However, scan enable clock signal 1044 causes programmable test clock controller 1000 to operate either in a silent state (e.g., for performing leakage IDDQ tests) or at-speed launch and/or capture. Note that the programmable test clock controller of FIG. 10 omits a scan clock decoder to simplify the discussion.

Figure 11:
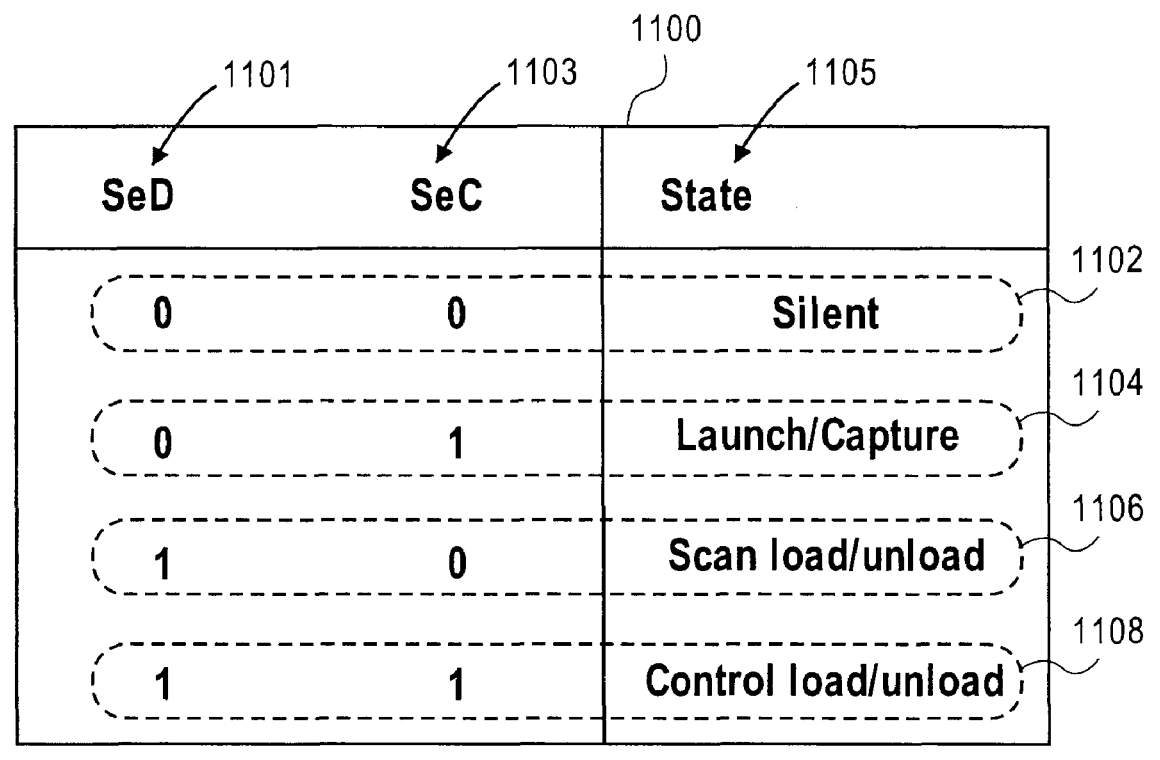

FIG. 11 is a table illustrating the states of operation for a programmable test clock controller based on multiple scan enable control signals in accordance with an embodiment of the invention. Table 1100 shows that scan enable data ("SeD") control signal 1101 and scan enable clock ("SeC") control signal 1103 create a set of signal states 1105 (or test modes) that can be used to implement the desired functions of a programmable test clock controller, according to various embodiments of the invention. During the silent state 1102, all clocks to the circuit under test are shut off, whereas in the launch/capture state 1104 an at-speed function clock is applied to the scan chain to execute a delay test. In the scan load/unload chains state 1106, the scan chains are either loaded or unloaded, and in the control load/unload state 1108, the programmable test clock controller can be programmed. Generally, the value of scan enable data control signal 1101 determines whether the programmable test clock controller operates either in the data delivery mode or the test execution mode. When SeD control signal 1101 has a value of 1, the programmable test clock controller engages in data delivery operations at relatively low-speed using a scan clock from an external source, such as an ATE device. Then, if SeC control signal 1103 has a value of 0, the programmable test clock controller either loads or unloads a scan chain to initialize the internal registers of a circuit to a known state. By contrast, a value of 1 for SeC control signal 1103 causes the programmable test clock controller to be programmed with clock command information. In silent state 1102, the programmable test clock controller applies no clock pulses to generate transitions to domains of the circuits under test. In this state, an ATE can force primary inputs ("PIs") to measure primary outputs ("POs") or to measure IDDQ leakage currents from power supply to ground. Note that when SeD control signal 1101 has a value of 0, the programmable test clock controller can engage in at-speed tests to either launch an input transition or capture a test response, or both, at relatively high-speeds using a functional clock.

Figure 12A:
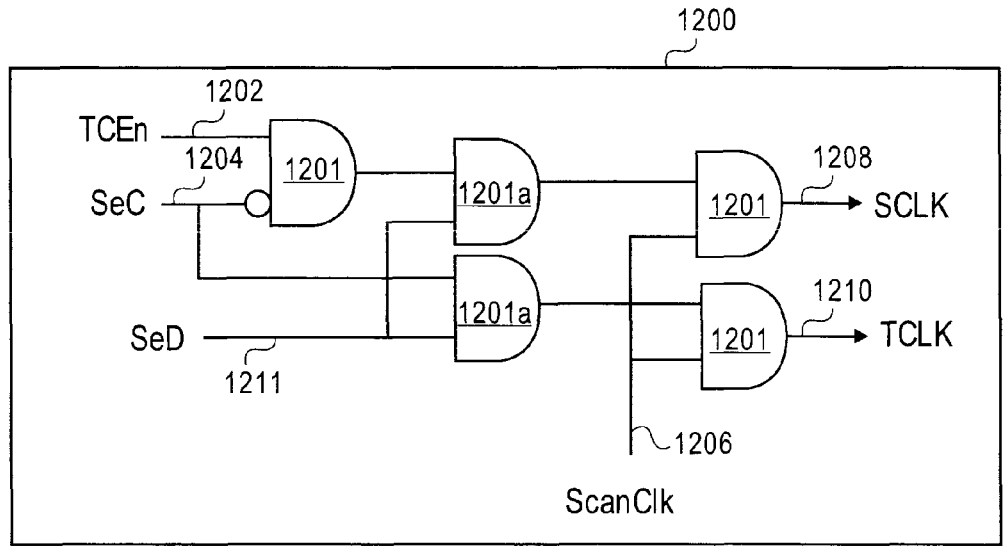
FIGS. 12A and 12B illustrate specific implementations of a scan clock decoder and a programmable test clock controller, respectively, according to various embodiments of the invention.
Figure 12B:
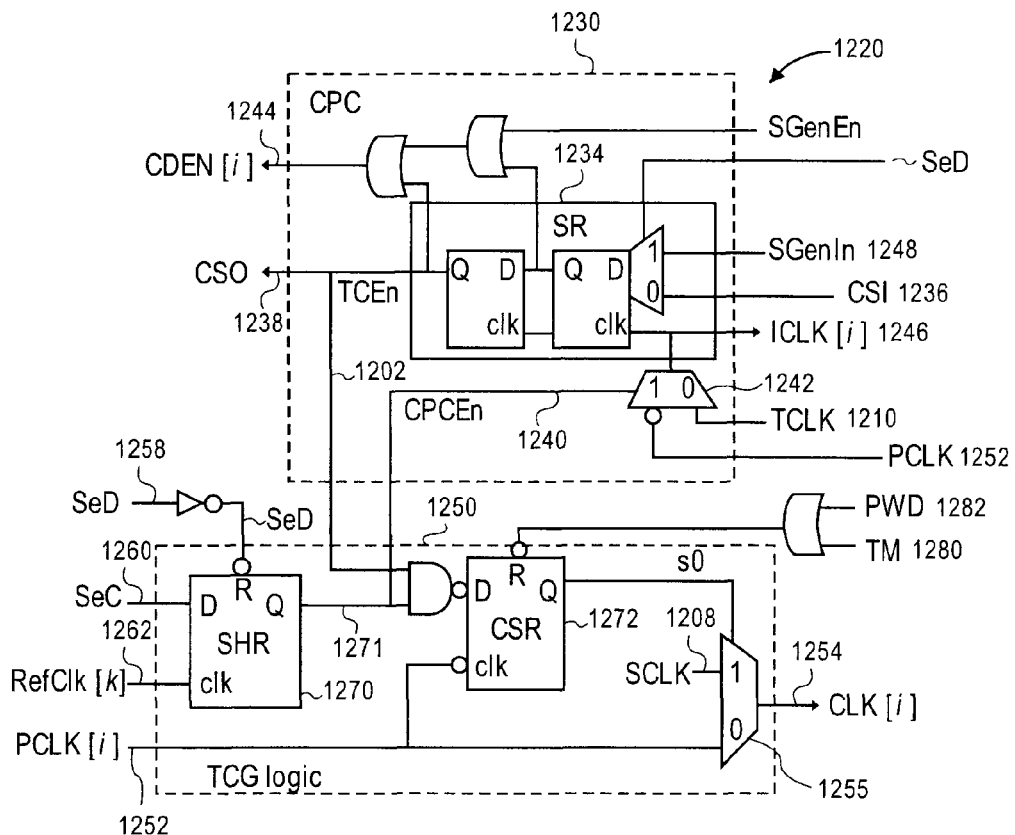

FIGS. 12A and 12B illustrate specific implementations of a scan clock decoder and a programmable test clock controller, respectively, according to various embodiments of the invention. In FIG. 12A, a scan clock decoder 1200 includes logic to generate a scan clock ("SCLK") 1208 to drive a scan chain and a control layer clock ("TCLK") 1210 for programming purposes, both of which are clock control signals. Logic gates 1201 use a primary scan clock ("ScanClk") 1206, a scan enable clock control signal ("SeC") 1204, and a clock control signal ("TCEn") 1202 to form the clock control signals SCLK, TCLK. In one embodiment, an ATE can generate and apply primary scan clock 1206 and scan enable clock control signal 1204 to a programmable test clock controller in FIG. 12B. In some embodiments, scan enable data control signal ("SeD") 1211 can be used to control operation of logic gates 1201a to disable formation (e.g., SeD at logical 0) of the clock control signals SCLK and TCLK independent from the state of primary scan clock ("ScanClk") 1206, which is generally provided by an external tester or ATE.

In FIG. 12B, a programmable test clock controller 1220 includes a clock pulse controller ("CPC") 1230 and a test clock generator ("TCG") 1250. Clock pulse controller 1230 provides a stream of clock edges as values of TCEn signal 1202 to test clock generator 1250, which uses the values of the clock edges to form an at-speed test clock. In one embodiment, clock pulse controller 1230 contains a 2-bit shift register ("SR") 1234, which can be serially loaded and unloaded via a control scan in ("CSI") terminal 1236 and a control scan out ("CSO") terminal 1238, respectively. In operation, 2-bit shift register 1234 provides TCEn signal 1202 with control values for generating up to 2 at-speed pulses based on functional clock ("PCLK") 1252 during launch and/or capture operations. In at least one embodiment, 2-bit shift register 1234 holds a programmed amount of individual clock edges to be shifted out to test clock generator 1250. TCEn signal 1202 shifts "at speed," based on functional clock ("PCLK") 1252, in the launch/capture state, so long as clock pulse controller enable ("CPCEn") signal 1240 has a value of logical 1. But 2-bit shift register 1234 shifts at a "scan-speed," based on a relatively slow primary scan clock ("ScanClk") 1206 of FIG. 12A, during the control chain load/unload operations.

Note that 2-bit shift register 1234 is not clocked with clock pulses during the silent state as well as the scan load/unload state, so the clock command information stored therein remains unchanged in these states. In some embodiments, clock pulse controller 1230 generates a clock domain enable ("CDEn [i]") control signal 1244 to selectably enable an "i-th" clock domain to participate in launch and/or capture operations. In alternative embodiments, clock pulse controller 1230 provides an ICLK signal 1246 to a supplemental clock command source (not shown) to receive supplemental clock command information from, for example, string generator input ("SGenIn") 1248. The supplemental clock command source extends the functionality of 2-bit shift register 1234 beyond 2 bits.

Test clock generator 1250 is designed to configure a test clock ("CLK") 1254 to provide a desired waveform composed of portions of functional clock 1252 and portions of scan clock ("SCLK") 1208. In particular, test clock generator 1250 multiplexes between scan clock ("SCLK") 1208 and functional clock ("PCLK") 1252. In some embodiments, functional clock 1252 can be logically AND-ed with TCEn signal 1202 to produce test clock 1254. Test clock generator 1250 uses SeD signal 1258 and SeC signal 1260 to select either functional clock 1252 or scan clock 1208 as sources of clocks. Further, test clock generator 1250 uses these signals to generate TCEn signal 1202 for crafting test clock ("CLK[i]") 1254. In operation, test clock generator 1250 synchronizes test clocks with clock pulse controller ("CPC") 1230 via clock pulse controller enable signal 1240, which is a clock rate control signal used to select the clock rate at which individual clock edges appear as test clock 1254.

In some instances, test clock generator 1250 can be considered as a stream multiplexer with suppression capability. That is, it multiplexes source clock signal waveforms AND-ed with a stream of TCEn signal values (i.e., values of individual clock edges) to create a waveform for test clock 1254. Further, the states of both SeC signal 1260 and SeD signal 1258 select which one of the source clocks is to be AND-ed with a stream of the TCEn signal values. A source clock pulse is suppressed if TCEn signal 1202 has a value of 0. Otherwise, the source pulse is passed on to form a part of test clock 1254. Further, test clock generator 1250 suppresses possible clock skew that arises from performing the bitwise-AND operation with the functional clock path by selecting scan clock ("SCLK") 1208 in a steady-state phase during which it is "shut off," or at a low logical value, when initiating launch and/or capture operations. An example of a steady-state phase is steady-state phase 908 of FIG. 9.

In the example shown in FIG. 12B, test clock generator 1250 includes a sample and hold register ("SHR") 1270 and a clock selection register ("CSR") 1272. Sample and hold register 1270 samples SeC signal 1260 using a reference clock ("RefClk[k]") 1262 and also provides clock pulse controller enable ("CPCEn") signal 1240 to clock pulse controller 1230 for test clock rate selection. If CPCEn signal 1240 has a value of 1, a multiplexer 1242 selects functional clock ("PCLK") 1252. With a value of 0, multiplexer 1242 selects control layer clock ("TCLK") 1210 to shift in and out clock command information bits. Sample and hold register 1270 generates a logical value of 1, if SeD signal 1258 has a value of 0 and SeC signal 1260 has a value of 1. Otherwise, output 1271 of sample and hold register 1270 remains at logical 0. In some embodiments, sample and hold register 1270 can also provide a synchronization timing reference point for performing inter-clock domain tests.

Sample and hold register 1270 also aids in performing stuck-at tests on the control logic in the control layer, since the control logic is clocked by the control layer clock ("TCLK") 1210. To implement stuck-at tests, RefClk 1262 is shut off. Sample and hold register 1270 is reset by SeD signal 1258 and remains reset during the static test. The reset value of sample and hold register 1270 selects the scan clock ("SCLK") 1208 during the static test. Since sample and hold register 1270 prevents the SeC signal 1260 from propagating to clock selection register 1272, SeC signal 1260 can be used to multiplex clock control signals, TCLK 1210 and SCLK 1208, for performing stuck-at tests. Thus, the launch/capture state of a programmable test clock controller can be used for capture during stuck-at testing of the control logic, whereas the scan load/unload state can be used for accessing data scan chains. Similarly, the silent state can be used for capture, whereas a control load/unload state can be used for accessing control chains during stuck-at testing of the circuit under test.

Clock selection register 1272 is configured to store clock selection control information, which selects the source clock to form configurable portions of test clock 1254. The clock selection control information of clock selection register 1272 is determined by the states of both sample and hold register 1270 and TCEn signal 1202. In the normal functional mode, the test mode signal ("TM") 1280 resets clock selection register 1272. Thus, functional clock 1252 is connected to test clock 1254. The state of clock selection register 1272 remains unchanged during the functional mode unless a power down signal ("PWD") 1282 is applied. Power down signal ("PWD") 1282 can halt operation of a corresponding clock domain during the normal functional mode. Powering down a clock domain can be a desired feature for testing low-power circuit applications. But power down signal ("PWD") 1282 can provided enhanced functionality to test structures for the various embodiments. In particular, PWD 1282 is incorporated into the test clock controller to perform clock gating without inserting extra logic gates that intervene along the functional clock path. Note that if PWD signal 1282 is set to shut off the functional clock for test clock 1254, multiplexer 1255 selects scan clock ("SCLK") 1208, which is inactive during the normal functional mode, so that no clock pulses are generated as test clock 1254. Further, PWD signal 1282 can also be used as a clock-halt circuit both in functional tests and silicon debug. As such, a problematic clock domain can advantageously be shut down in case an embedded internal monitor circuitry (not shown) detects a system error. If an error is detected, the corresponding clock domains can be halted to prevent it from propagating further. This simplifies the debug process, especially when compared to debugging circuits that use conventional scan chain structures, which include relatively long scan chains that lack control mechanisms to detect errors quickly. Often, it is the length of conventional scan chains and the outputs from the intervening logic that either obscure the errors or delay detection beyond a few clock cycles. By contrast, various embodiments of the invention can employ PWD 1282 to halt testing to quickly detect errors within, for example, a couple of clock cycles or fewer. Note that PWD signal generators for creating power down signal ("PWD") 1282 are well-known in the art of circuit design to provide for low-power circuit applications and need not be discussed in detail.

Figure 13:
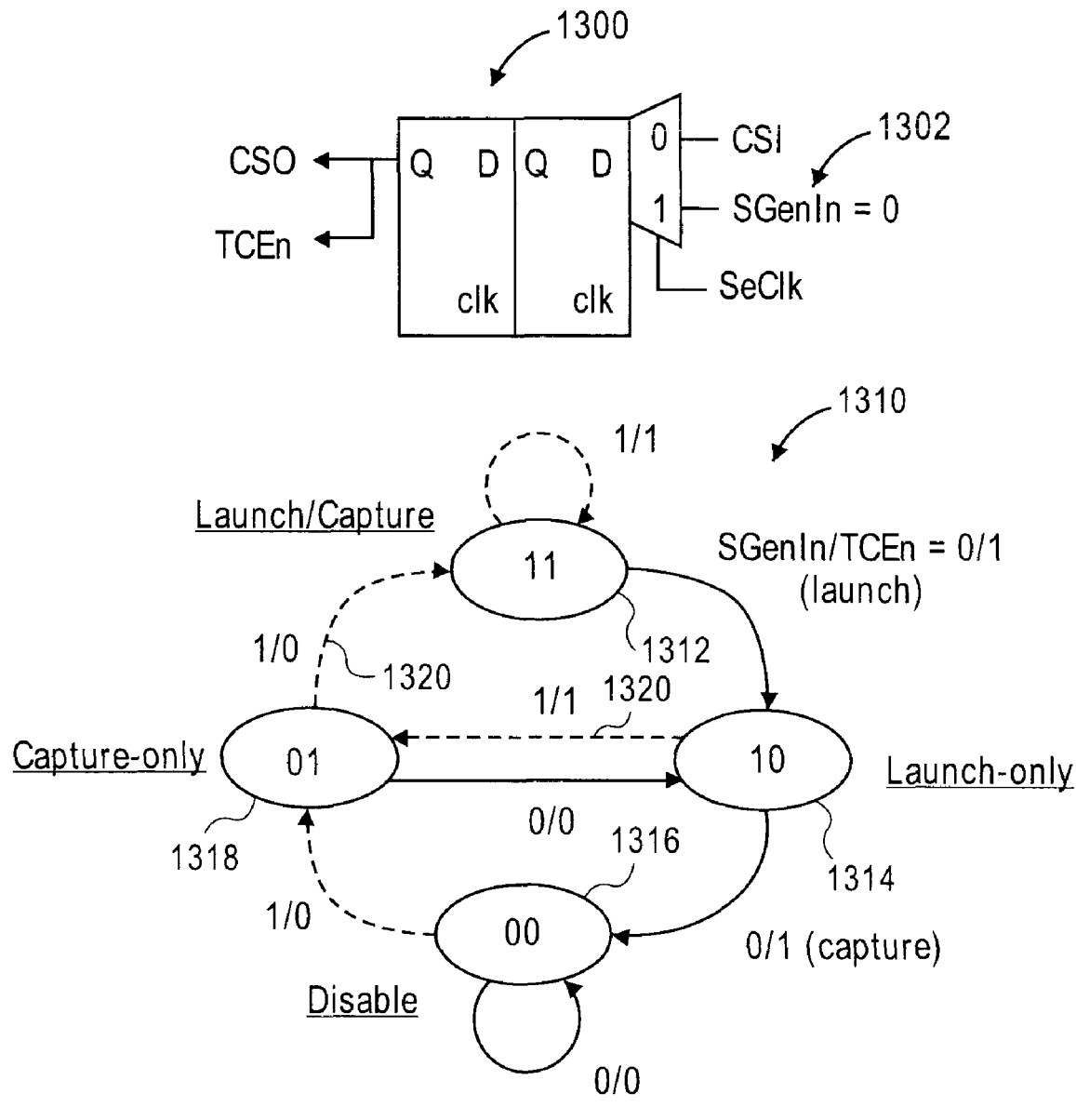
FIG. 13 depicts a state diagram for a clock pulse controller suitable to practice the programmable test clock controller of FIG. 12B for programming a specific clock domain, according to one embodiment of the invention

FIG. 13 depicts a state diagram for an example of the 2-bit shift register of FIG. 12B for programming a specific clock domain, according to one embodiment of the invention. By loading 2-bit shift register 1300, an individual clock domain can be programmed for scan load and unload operations, as well as for launch and capture operations. State diagram 1310 summarizes how TCEn signal 1202 of FIGS. 12A and 12B is generated from a programmed state stored within 2-bit shift register 1300. State diagram 1310 assumes that a string generator input ("SGenIn") 1302 from a supplemental clock command source is not used (i.e., SGenIn terminal is set to a value of 0). Each state from state 1312 to state 1318 represents the contents of 2-bit shift register 1300, with the transition being labeled with an "SGenIn/TCEn" notation. Note that due to an input constraint that excludes the use of a supplemental clock command source (i.e., SGenIn=0), some transitions denoted as broken lines 1320 are not applicable. Initial states of 2-bit shift register 1300 include launch/capture state 1312 (contents of SR are "11"), launch-only state 1314 (contents of SR are "10"), capture-only state 1318 (contents of SR are "01") and disable state 1316 (contents of SR are "00"). In sum, the number of ones in 2-bit shift register 1300 corresponds to the number of functional clock pulses that can be passed on as the test clock, CLK[i].

If, for example, 2-bit shift register 1300 includes the contents "11," two consecutive functional clock pulses are generated to form the test clock—one pulse edge for a launch operation and another pulse edge for the capture operation. After launch/capture state 1312 concludes, 2-bit shift register 1300 reaches a disable state 1316, with contents of "00," thereby disabling the test clock CLK. Specifically, disable state 1316 disables the scan clock, SCLK. Note that the SCLK can be quiescent during launch/capture. Similarly, if 2-bit shift register 1300 contains values of either "10" or "01," one functional clock pulse issues for launch-only state 1314 and capture-only state 1318. The difference between launch and capture clock pulse edges is the temporal displacement of their clock edges. For example, the launch clock pulse generally precedes the capture clock pulse by at least one functional ("PCLK") clock period.

To implement scan load and unload operations, the initial state of 2-bit shift register 1300 provides TCEn signal values that determine whether the test clock includes scan clock pulses or not. If 2-bit shift register 1300 includes the contents of "1x," then the scan clock is enabled for scan load and unload operations where x denotes a "don't-care." But if the contents are "0x," then the scan clock is disabled and no pulse edges are applied to the scan chain. Note that the value of the TCEn signal is generally unchanged during scan load/unload. In one embodiment, the AND gate in the SCLK path can be removed if all scan chains are to be loaded/unloaded at once rather than selectably.

Figure 14A:
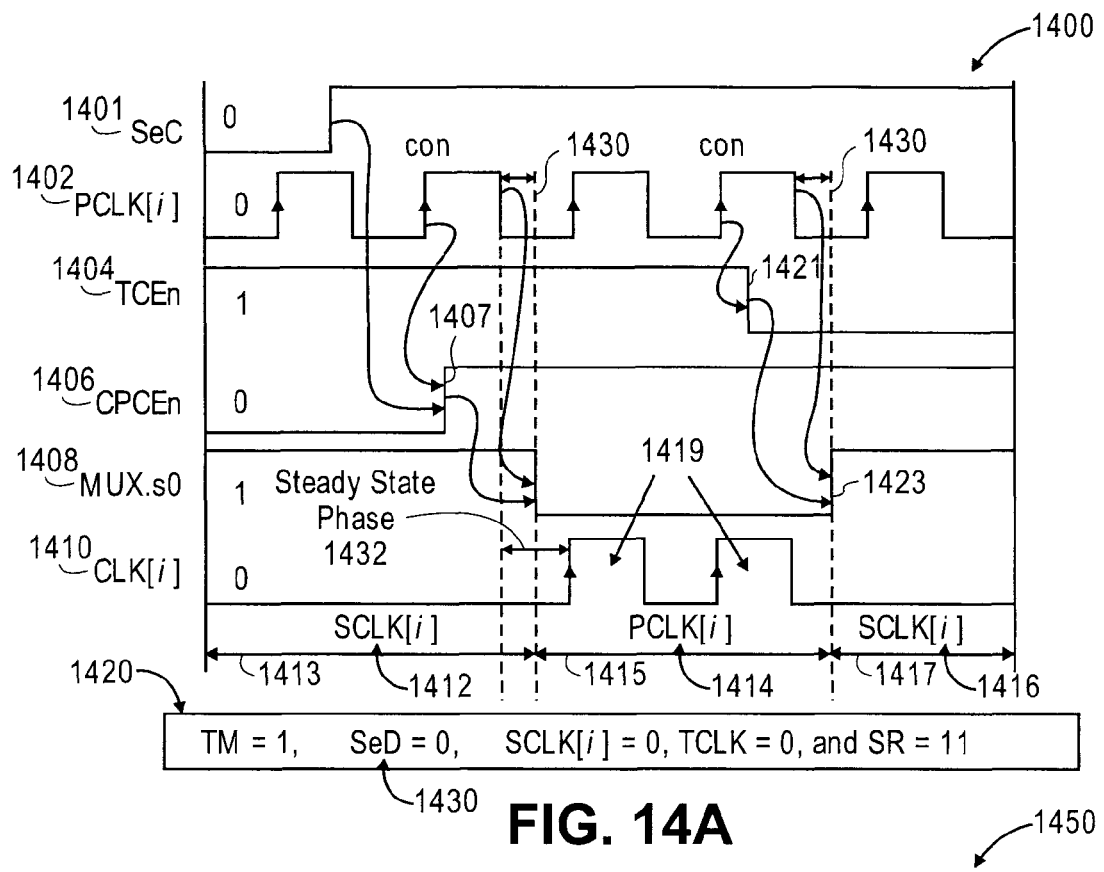
FIG. 14A and FIG. 14B illustrate the timing of signals to configure a programmable test clock controller to construct a test clock for launch and capture operations, and disable a clock domain for which it corresponds, respectively, according to various embodiments of the invention.
Figure 14B:
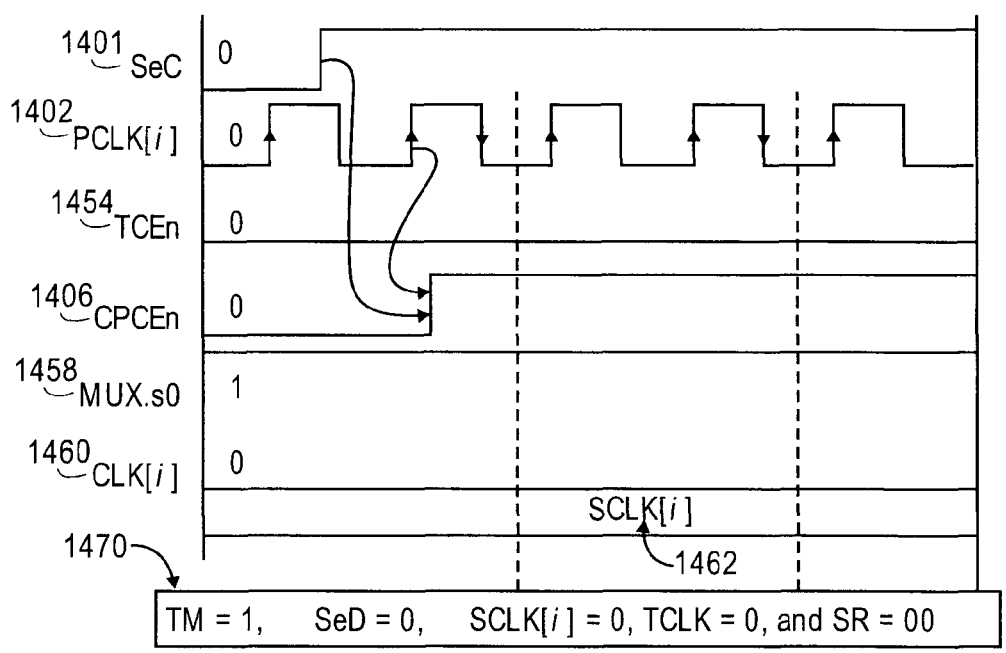

FIG. 14A and FIG. 14B illustrate the timing of signals to configure a programmable test clock controller to construct a test clock for performing launch and capture operations and for disabling a clock domain to which it corresponds, respectively, according to various embodiments of the invention. Timing diagram 1400 of FIG. 14A illustrates how a programmable test clock controller uses a scan clock ("SCLK") signal and a functional clock ("PCLK") signal 1402 to generate a configurable test clock waveform ("CLK") 1410 for launch and/or capture operations. Consider that other signals 1420 are initialized to the states shown. CPCEn signal 1406 is set to value of logical 0 after a scan load or unload operation. The value of CPCEn signal 1406 forces the value of output signal "Mux.S0") 1408 to be logical 1. When both a SeC signal 1401 and a SeD signal 1430 are set to a value of logical 0, CPCEN signal 1406 maintains a value of logical 0, thereby holding a clock selection register ("CSR") output signal ("Mux.S0") 1408 to a logical value of 1. As such, CSR output signal 1408 causes a multiplexer to select scan clock ("SCLK[i]") 1412, which forms test clock 1410 during scan mode interval 1413. Next, consider that the clock pulse controller is programmed to include the value of "11" in its shift register (i.e., SR=11) during a load operation from a control chain when TCEn signal 1404 is enabled (i.e., at a value of 1). The state of CSR continues to generate a value of logical 0 for CPCEn signal 1406 until SeC signal 1401 transitions to a logical value of 1. Then, at the first falling edge 1490 of functional clock, signal 1402 after SeC signal 1401 is sampled into the sample and hold register, the value of a logical 1 at edge 1407 for CPCEn signal 1406 is captured into the clock selection register. If the state of the clock selection register contents changes CSR output signal 1408 from a logical value of 1 to 0, a multiplexer selects the functional clock ("PCLK[i]") 1414 as test clock 1410. During the functional mode interval 1415, two consecutive functional clock pulses 1419 are enabled by TCEn signal 1404 as a launch clock pulse and a capture clock pulse. Note that for each functional clock pulse 1419, a logical value of 0 is shifted into the shift register (e.g., via the SGenIn input, which is set to logical zero). When the shift register reaches the disable state (i.e., its contents include the value "00"), then TCEn signal 1404 is disabled and drops to a logical value of 0 at edge 1421. Further, CSR output signal 1408 then changes state at edge 1423, thereby returning the programmable test clock controller to a scan mode during interval 1417 to output a scan clock ("SCLK[i]") 1416 as test clock 1410.

Note that scan clock 1412 is generally kept at a steady-state value of 0 when the SeD signal is at logical 0. The programmable test clock controller targets the transition of a multiplexer output (i.e., output signal 1408) to occur approximately in the middle 1430 of a duty cycle of functional clock 1402, when it is at a steady-state value of logical 0. Advantageously, switching test clock 1410 in the middle 1430 of a steady-state phase 1432 provides a tolerance to process variations that may occur in manufacturing, thereby reducing timing uncertainties as well as maintaining unaltered functional clock duty cycles.

Timing diagram 1450 of FIG. 14B illustrates how a programmable test clock controller generates a configurable test clock waveform to disable a clock domain, according to one embodiment of the invention. Consider that other signals 1470 are initialized to the states shown. As such, the shift register ("SR") is loaded with the contents of "00," thereby generating TCEn signal 1454 values of logical 0. As a consequence, the clock selection register generates a CSR output signal 1458 having a logical value of 1, thereby selecting scan clock ("SCLK[i]") 1462 as test clock 1460. Hence, neither scan pulses nor functional pulses are generated for the test clock.

Figure 15:
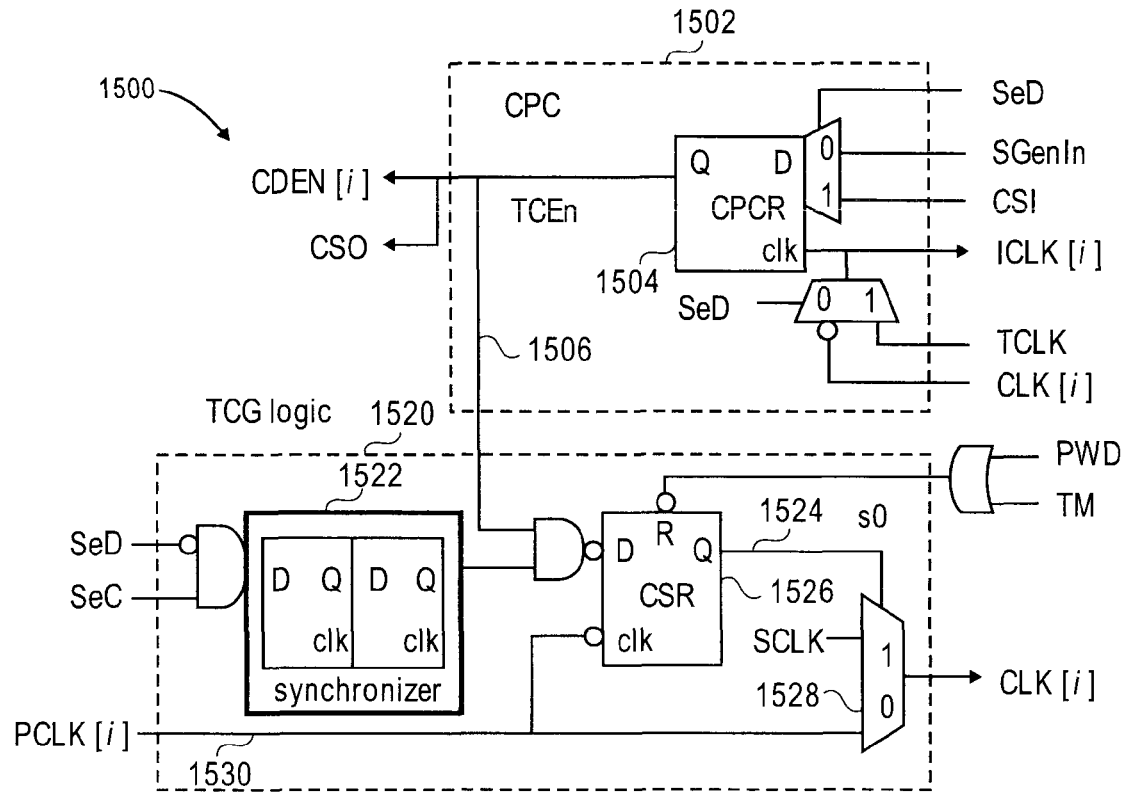
FIG. 15 depicts a programmable test clock controller including a simplified clock pulse controller and a simplified test clock generator, according to one embodiment of the invention.

FIG. 15 depicts a programmable test clock controller including a simplified clock pulse controller and a simplified test clock generator, according to one embodiment of the invention. Programmable test clock controller 1500 includes simplified clock pulse controller 1502 and simplified test clock generator 1520, both of which interact with similarly-named signals described in FIG. 12B. While programmable test clock controller 1500 behaves similar to the programmable test clock controller of FIG. 12B, it is specifically configured to provide launch and/or capture operations and sequential test capabilities. In this case, simplified clock pulse controller 1502 includes a 1-bit shift register ("CPCR") 1504 for storing and providing a single bit. For example, programmable test clock controller 1500 can provide a corresponding stream of TCEn signal 1506 values, such as 1[1*00] or 0[x*], where the initial state of 1-bit shift register 504 includes only the first bit (i.e., the bits between the brackets are externally supplied). In this case, the clock rate control signal (e.g., the CPCEn signal) is derived from SeD 1521. Signal SeD 1521 forces MUX 1508 to select the CLK[i] after scan load/unload. The CLK[i], however, is generally quiescent until the output of CSR 1524 is set to select the CLK[i]. This is caused by a change in the value of signal SeC 1523 from logical 0 to 1. Programmable test clock controller 1500 can implement both 1-bit shift register 1504 and clock selection register 1526 as an effective 2-bit shift register ("SR") to accommodate TCEn signal 1506 values for launch and capture operations. Note that clock selection register 1526 determines the test clock for both clock command information loading and at-speed testing. In operation, the content of 1-bit shift register 1504 is copied into clock selection register 1526 before launch or capture operations. By shifting 1-bit shift register 1504, the value of TCEn signal 1506 is applied via output 1524 to multiplexer 1528. In another embodiment, simplified test clock generator 1520 includes a 2-bit synchronizer 1522 to accommodate cases for which synchronous sample-and-hold may not be sufficient to ensure accurate or safe test operations. While not shown, a reference clock, RefClk[k], also can be used to drive synchronizer 1522 instead of functional clock ("PCLK[i]") 1530.

Figure 16:
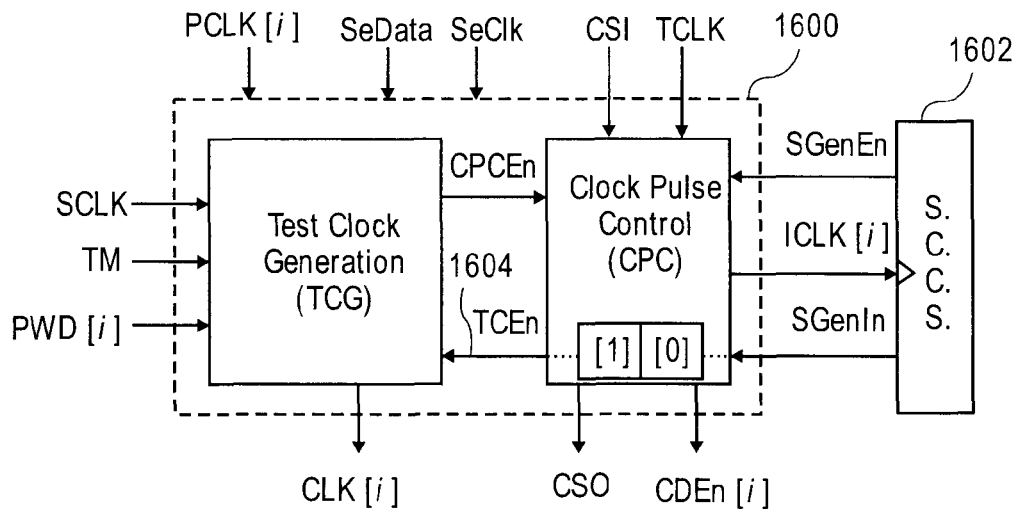
FIG. 16 depicts a programmable test clock controller including a supplemental clock command source, according to one embodiment of the invention.

FIG. 16 depicts a programmable test clock controller including a supplemental clock command source, according to one embodiment of the invention. As shown, programmable test clock controller 1600 is coupled to supplemental clock command source ("SCCS") 1602 to suppress or delay a generated functional clock pulse by a programmable amount of time. Supplemental clock command source 1602 can be, for example, a finite state machine that generates a desired binary bit stream as clock control ("TCEn") signal values for individual clock edges. Referring back to FIG. 12B, note that if SGenIn signal 1248 is not constrained (i.e., it is not held to a steady-state low value that otherwise disables a programmable test clock controller after shifting out 2 bits), a bit stream generated by supplemental clock command source 1602 can facilitate multi-cycle path testing. As such, a capture clock edge can be delayed by multiple cycles by suppressing a number of functional clock pulses after a particular launch clock edge. Referring to FIG. 13, consider that a multi-cycle clocking scheme can be implemented by first starting from launch-only state 1314 (i.e., with the contents programmed to "10") as an initial state for 2-bit shift register 1300. Then, TCEn signal values 1604 of FIG. 16 of 10[0*100*] can support multi-cycle path for delay testing. The supplemental clock command information [0*100*] (i.e., the rest of the sequence after the first two bits of "10") can be supplied by supplemental clock command source 1602.

Advantageously, supplemental clock command source 1602 generates TCEn values of 10*100* for multi-cycle, 1*00* for sequential, and 0*100* for either launch-only or capture-only to correspondingly implement multi-cycle path test operations, sequential test operations, and delayed launch-only operations or capture-only operations. The first 2 bits of TCEn values 1604 can be stored in the clock pulse controller. Note that the first occurrence of "x*" is followed by complement of "x," which is again followed by "00*." The last string "00*" disables the functional clock at the end of test actions, thereby placing programmable test clock controller 1600 into a disable state. In some embodiments, supplemental clock command source 1602 can be a k-bit shift register to provide up to k-bit of values (or individual clock edges) for TCEn signal 1604. If, however, k is relatively large, a string generator can be employed to reduce hardware overhead.

Figure 17A:
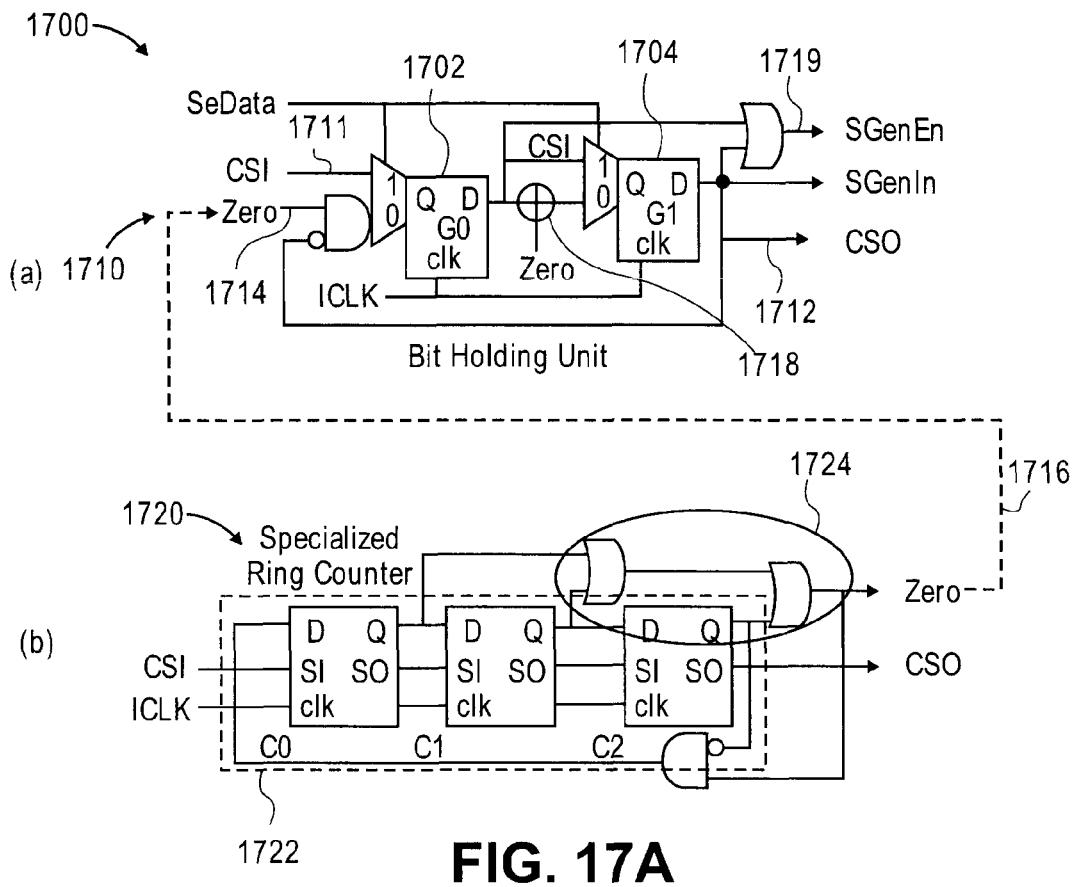
FIGS. 17A and 17B illustrate a supplemental clock command source implemented as a string generator and a corresponding state diagram, respectively, according to various embodiments of the invention.
Figure 17B:
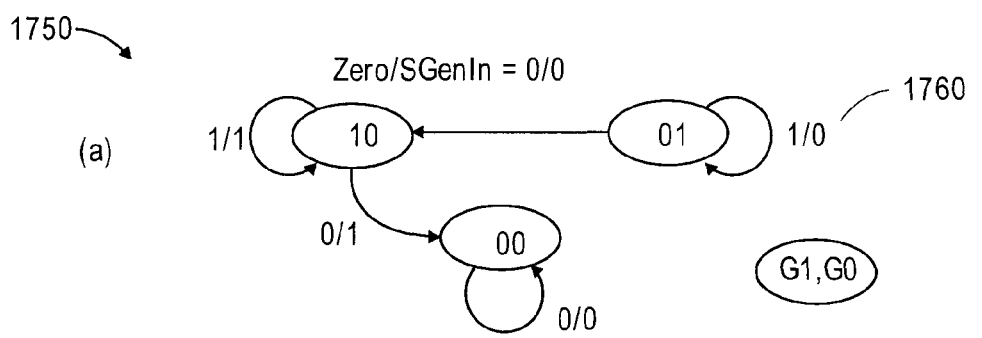
Figure 17B:
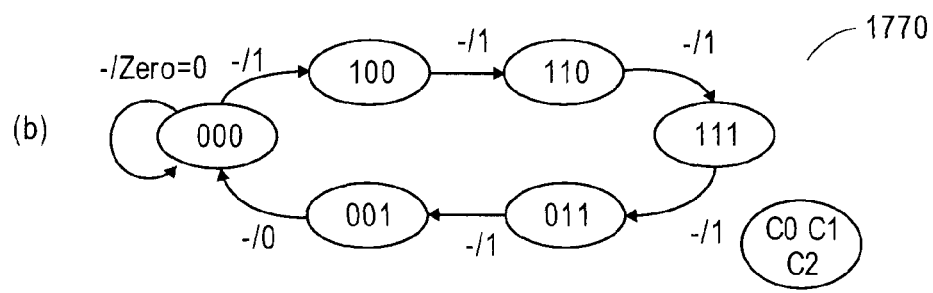

FIGS. 17A and 17B illustrate a supplemental clock command source implemented as a string generator and a corresponding state diagram, respectively, according to various embodiments of the invention. In one embodiment, string generator 1700 generates a string of data bits representing supplemental clock command information, with the string having a bit length that is generally longer than a quantity of memory elements required to store k data bits in, for example, k bit registers. String generator 1700 includes a bit-holding unit 1720 configured to store a first pulse value and a second pulse value, and a specialized ring counter 1720 for effecting a logic transition of the most significant bit ("MSB") in the specialized ring counter after a number of intervening clock cycles is shifted between the first pulse value and the second pulse value. For example, bit-holding unit 1720 can generate a logic value of either 0 or 1 "n" times in a stream of TCEn signal values. Specialized ring counter 1720 tracks the number of pulses to be generated. The initial content of specialized ring counter 1720 can be loaded or unloaded serially via CSI 1711 and CSO 1712. During launch and capture operations, it keeps counting until a zero state is reached.

In operation, bit-holding unit 1710 holds an initialized value until a Zero ("Zero") signal 1716 having a value of logical 0 reaches terminal 1714. As such, Zero signal 1716 indicates whether specialized ring counter 1720 has reached a zero state or not. Register ("G1") 1702 and register ("G0") 1704 are initialized with complementary logic values before, for example, a launch and/or capture operation proceeds. A complement logic value is outputted to clock pulse controller (not shown) at the end of the count. Specialized ring counter 1720 remains at a zero state until it is reloaded. To illustrate, consider that zero signal 1716 has a value of logical 1 and registers 1702 and 1704 contain complementary logic values. Further, an XOR-gate 1718 introduces an extra inversion to keep the contents of register 1704 from changing. Next, consider that zero signal 1716 has a value of logical 0, thereby configuring bit-holding unit 1710 as a 2-bit shift register. Note that XOR-gate 1718 functions as an inverter when zero signal 1716 has a value of logical 1, but operates as a buffer otherwise. Thus, two functional clock cycles after zero signal 1716 reaches a value of 0, each of registers 1702 and 1704 contains a logical value of 0. Based on the contents from both registers 1702 and 1704, SGenEn signal 1719 is generated to indicate whether string generator 1700 is enabled or not. If registers 1702 and 1704 respectively contain logical values of 0 and 0, SGenEn signal 1719 indicates that string generator 1700 is disabled (and remains disabled until it is reloaded). Otherwise, string generator 1700 is enabled for launch and/or capture operations. State diagram 1750 of FIG. 17B includes a state diagram 1760 for describing the operation of bit-holding unit 1710.

Referring back to FIG. 17A, specialized ring counter 1720 is programmable to contain a number of functional clock cycles (e.g., a number of individual clock edges between a launch clock edge and a capture clock edge) for register ("G1") 1704 to hold. String generator 1700 employs specialized ring counter 1720 having zero detection capability. In the example shown, specialized ring counter 1720 implements a 3-bit ring counter 1722. Advantageously, 3-bit ring counter 1722 maintains a worst-case delay of a single OR-gate delay for the Zero output during launch and capture operations. 3-bit ring counter 1722 limits the delay to 1 OR-gate delay by enabling the most significant bit ("MSB") of specialized ring counter 1720 to set the output signal as zero signal 1716 with a logical 1-to-0 transition. The chain 1724 of OR-gates provides a false path in that no transition can be propagated from the least significant bit ("LSB") to directly determine the zero value for zero signal 1716. Note that specialized ring counter 1720 can count up to 2N, where N is the number of flip-flops used to implement an M-bit ring counter in other embodiments of the invention. Other counters can also be incorporated into the string generator. State diagram 1750 of FIG. 17B includes a state diagram 1770 for describing the behavior of 3-bit ring counter 1722.

Figure 18:
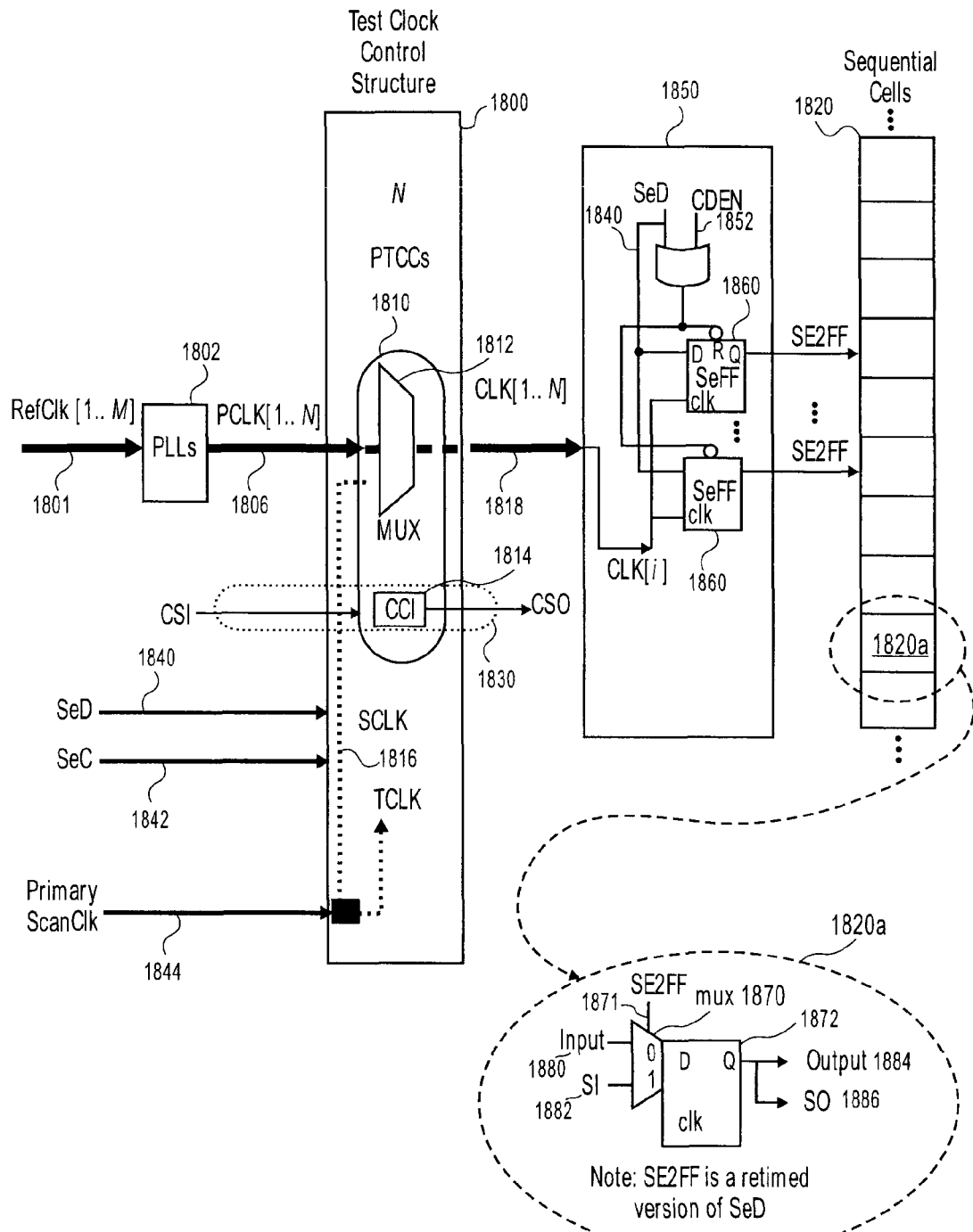
FIG. 18 depicts a block diagram showing a conceptual test clock control structure implementing any number of programmable test clock controllers to test an electronic device and its circuits, according to an embodiment of the invention.

FIG. 18 depicts a block diagram showing a conceptual test clock control structure implementing any number of programmable test clock controllers to test an electronic device and its circuits, according to an embodiment of the invention. Test clock control structure 1800 includes any number, N, of programmable test clock controllers ("PTCC"), one of which is depicted as PTCC 1810. Each PTCC in test clock control structure 1800 includes a multiplexer ("MUX") 1812 to multiplex between source clocks, such as a scan clock ("SCLK") 1816 and one of functional clocks ("PCLK[1 . . . N]") 1806. In this example, one or more PLL circuits 1802 generate functional clocks 1806 from one or more reference clocks ("RefClk[1 . . . M]") 1801 having phases locked to PLL output clocks 1806. Further, each PTCC includes logic 1814 to apply clock command information ("CCI") to drive one or more flip flops and/or scan chains in scan chains 1820 with at least one test clock from test clocks ("CLK[1 . . . N]") 1818. A Scan chain 1820 includes any number of sequential cells 1820a, one of which is shown in FIG. 18. In one embodiment, sequential cell 1820a includes a multiplexer ("mux") 1870 and a storage element 1872. Multiplexer 1870 is controlled by SE2FF signal 1871, which is a re-timed version of scan enable data ("SeD") control signal 1840, to switch either an input 1880 (e.g., as resultant data from a circuit under test) or a scan chain input ("SI") 1882 (from a previous sequential cell) into storage element 1872. The storage element is configured to provide data as an output 1884 (e.g., as stimulus data to the circuit under test) and/or to a next sequential cell via scan output ("SO") 1886.

In this example, PTCC 1810 receives the clock command information from at least a portion of a control chain 1830. Note that in some embodiments, scan chains 1820 and/or control chain 1830 can each comprise either a single chain (e.g., to serially shift data) or any number of portions of scan chains (e.g., to shift data in parallel). In some embodiments, an ATE (not shown) generates SeD signal 1840, SeC signal 1842, primary scan clock ("ScanClk") signal 1844, and reference clocks 1801. In at least one embodiment, these ATE-generated signals are global signals. That is, they are applied to the PTCCs in test clock control structure 1800. In some embodiments, an optional design-for-test ("DFT") block 1850 is added. DFT block 1850 includes a number of flip flops ("SeFFs") 1860 controlled by SeD signal 1840 and Clock Domain Enable ("CDEn") signal 1852. Generally, SeFFs 1860 to ensure timing constraints of SeD signal 1840 are met for last-shift-launch test protocols, for example, in large systems (e.g., systems on a chip). When logic 1814 includes clock command information to effect launch and/or capture operations, CDEn signal 1852 adjusts the content of SeFFs 1860 based on the content programmed into the corresponding PTCC. The state of CDEn signal 1852 retains the contents of SeFFs 1860 in enabled clock domains and resets SeFFs 1860 in disabled clock domains. Hence, only the enabled clock domains can participate in last-shift-launch testing while other clock domains can be disabled or can operate in functional mode.

Figure 19:
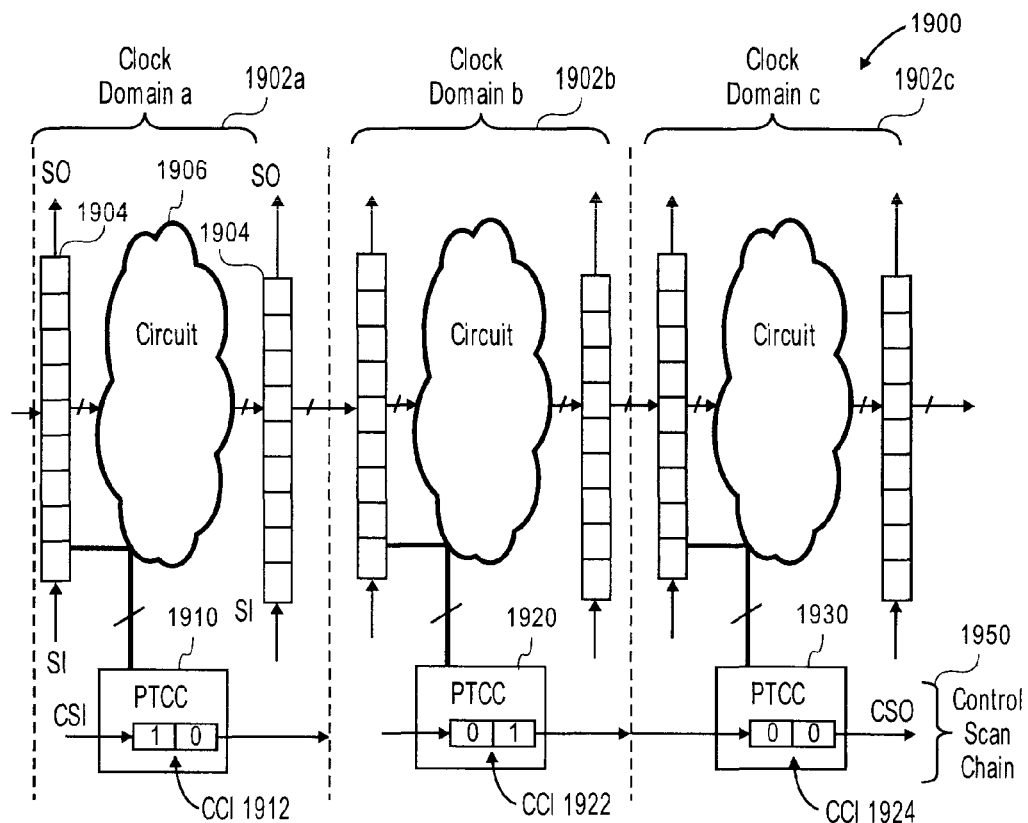
FIG. 19 is a diagram showing a test clock control structure implementing programmable test clock controllers to test circuits in different domains, according to an embodiment of the invention.

FIG. 19 is a diagram showing a test clock control structure implementing programmable test clock controllers to test circuits in different domains, according to an embodiment of the invention. Test clock control structure 1900 (or a portion thereof) includes programmable test clock controllers ("PTCC") 1910, 1920 and 1930 to interact with clock domains 1902a, 1902b and 1902c, respectively. Each clock domain 1902 includes one or more scan chains 1904 (or portions thereof) and a circuit 1906 under test. In this example, scan chains 1904 in clock domains 1902 are parallel in that one or more scan chain portions 1904 can be subject to, for example, a scan unload/load operation, while others are not. Further, one or more clock domains can be exercised with the same or different types of testing protocol while others can remain idle or engage in other tests. For example, consider that clock command information ("CCI") 1912 and 1922 loaded into PTCCs 1910 and 1920, respectively, cause a launch operation in clock domain 1920a and a capture operation in clock domain 1920b, thereby implementing an inter-domain test. This can occur while the scan chain portions 1904 of clock domain 1902c are subject to a load/unload operation or are inactive (e.g., to perform a static test), for example, as a result of PTCC 1930 disabling domain 1902c in response to CCI 1924. As test clock control structure 1900 provides a flexibility to test one or more clock domains 1902 in parallel, it reduces the sequential dependency between clock domains, which, in turn, reduces the complexity of automated test pattern generation. Advantageously, the implementation of parallel domains in test clock control structure 1900 can reduce overall test time and test data volume by reducing the number of scan loads/unloads operations. While FIG. 19 depicts domains 1902 as clock domains, they can be characterized as any other type of domains, such as power domains. The foregoing regarding test clock control structure 1900 is also applicable to FIGS. 23 and 24 below.

Figure 20:
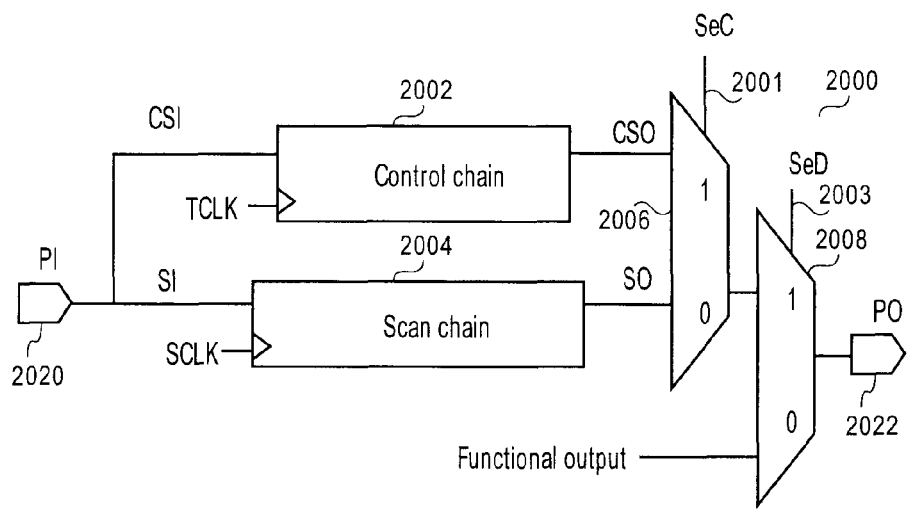
FIG. 20 is a diagram showing control chains and scan chains sharing primary inputs and primary outputs to reduce test access points, according to an embodiment of the invention.

FIG. 20 is a diagram showing control chains 2002 and scan chains 2004 sharing primary inputs 2020 and primary outputs 2022 to reduce test access points, according to an embodiment of the invention. In this example, SeC signal 2001 causes multiplexer 2006 to select data shifted from either control chain 2002 or scan chain 2004, whereas SeD signal 2003 causes multiplexer 2008 to select data shifted from the chains or from a functional output.

Figure 21:
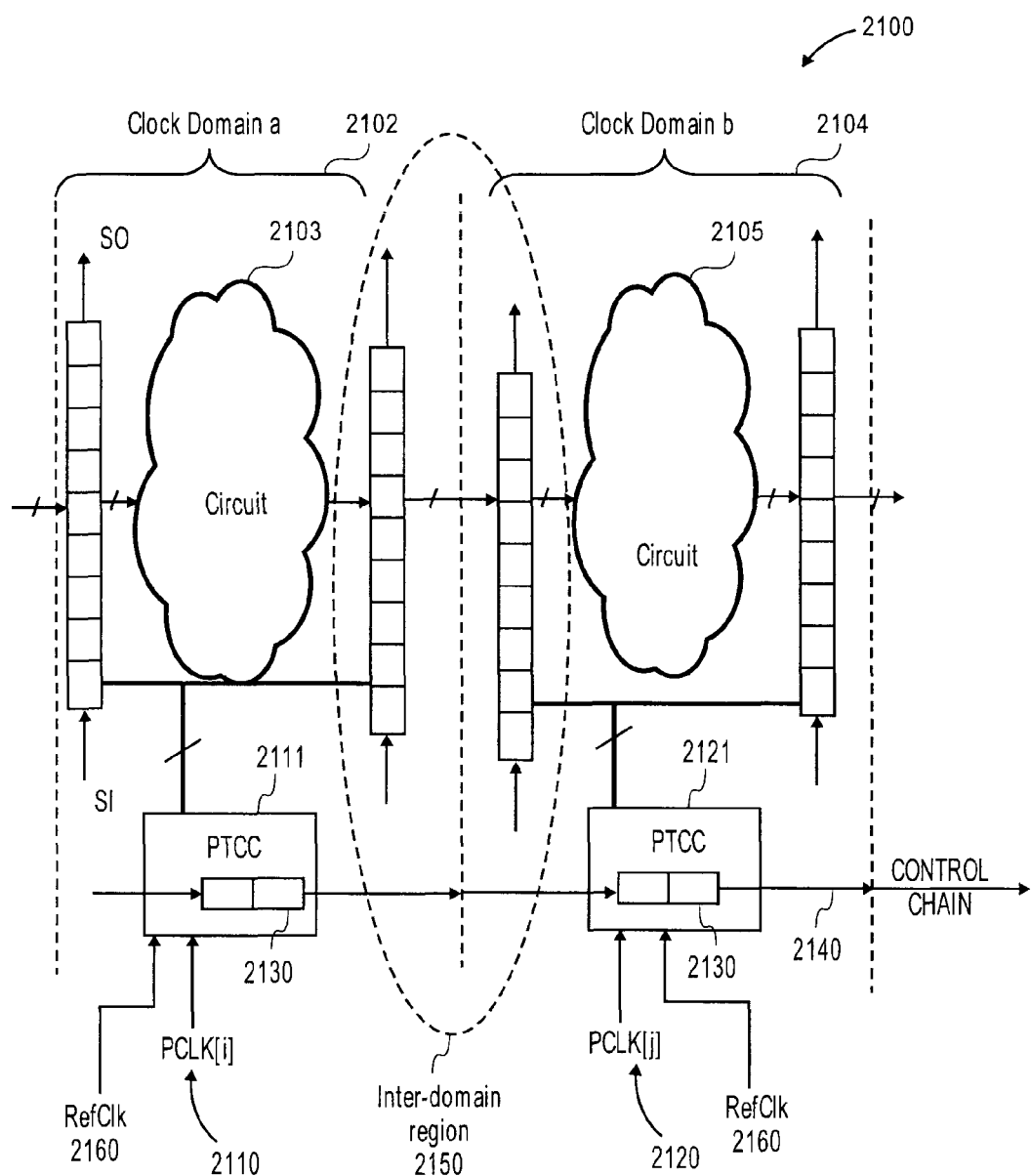
FIG. 21 illustrates a test clock control structure configured to perform inter-domain testing, according to one embodiment of the invention.

FIG. 21 illustrates a test clock control structure configured to perform inter-domain testing, according to one embodiment of the invention. Test clock control structure 2100 includes programmable test clock controller ("PTCC") 2111 and PTCC 2121 for coordinating delay tests for two clock domains. Clock domain 2102 and clock domain 2104 respectively include circuit 2103 and 2105, both of which are designed to operate at disparate clock frequencies. As such, PTCC 2111 can use functional clock PCLK[i] 2110 to generate a first clock rate, whereas PTCC 2121 can use functional clock PCLK[j] 2120 to generate a second clock rate. According to various embodiments of the invention, clock pulse controllers 2130 in PTCCs 2111 and 2121 can be programmed via control chain 2140 to respectively execute launch-only and capture-only operations—in relative synchronicity—to test interface circuits and the like in inter-domain region 2150. To orchestrate multi-cycle path test operations, including launch-only and capture-only operations, a computing device configured to function as an automated test pattern generator ("ATP Generator") can generate test patterns that synchronize operation of PTCCs 2111 and 2121 for effectuating inter-domain tests to detect faults in inter-domain region 2150. For example, ATP Generator can use a common reference clock ("RefClk") 2160 to establish a timing reference point. In other embodiments, ATP Generator can also use different reference clocks that are asynchronous with respect to each other to perform inter-domain testing. Note that in some embodiments the term "multi-cycle path test" can refer generally to either inter-domain testing or intra-domain testing, or both.

Figure 22A:
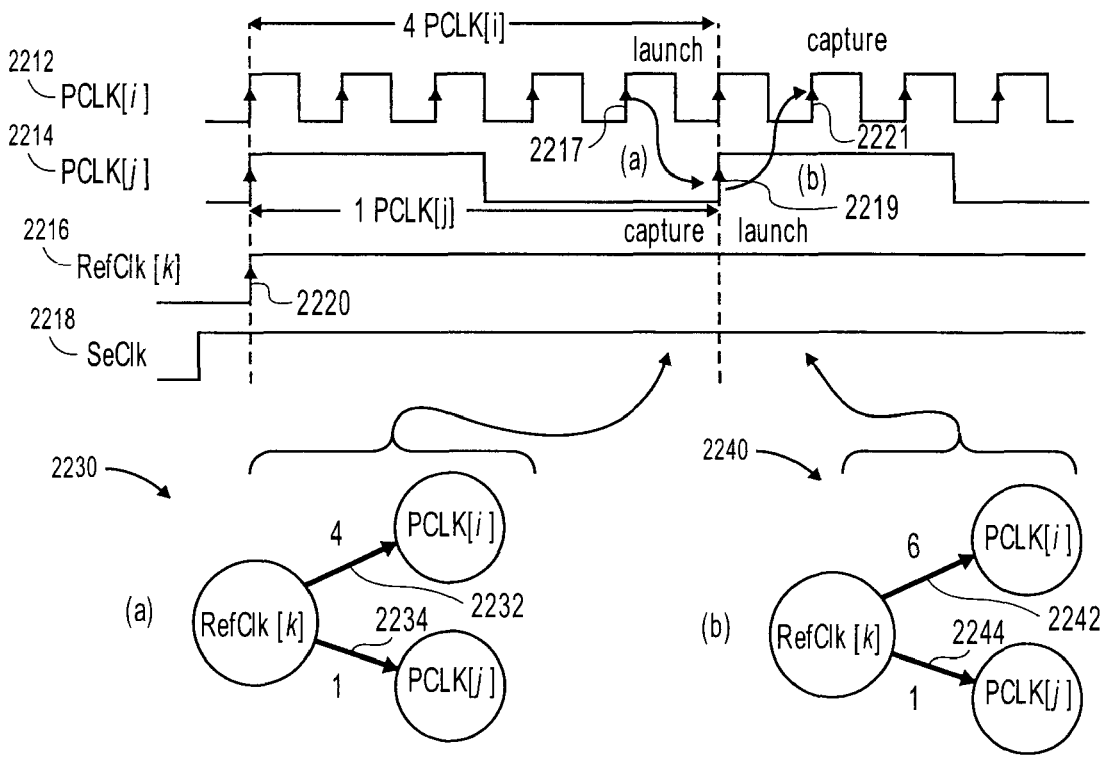
FIGS. 22A and 22B illustrate various techniques for calculating temporal distances using one or more timing reference points to implement inter-domain testing, according to various embodiment of the invention.
Figure 22B:
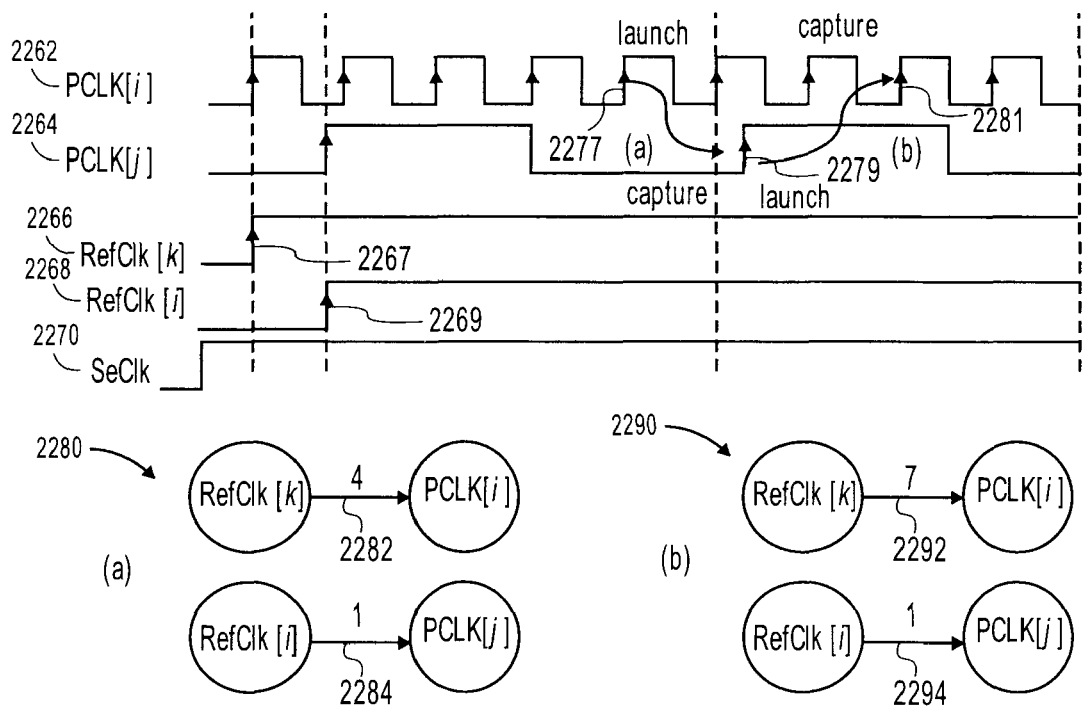

FIGS. 22A and 22B illustrate various techniques for calculating temporal distances using one or more timing reference points to implement inter-domain testing, according to various embodiments of the invention. FIG. 22A shows how a common reference clock ("RefClk[k]") 2216 is used to provide a timing reference point 2220 to determine a number of clock cycles to delay an operation performed by one or more programmable test clock controllers ("PTCC"). A PTCC can delay either a launch operation or a capture operation after a SeC signal 2218 is sampled. A PTCC delays an operation with respect to the test clock in its specific clock domain. Consider that an inter-domain (e.g., inter-clock domain) test can be designed to effect a launch from a clock domain [i] into another clock domain [j] in which a capture will occur. As such, a launch clock pulse of clock domain [i] can be delayed by 4 PCLK[i] clock cycles after SeC signal 2218 is sampled. Further, the capture operation for clock domain [j] can be delayed by 1 PCLK[j] clock cycle. Note that the phase of RefClk[k] clock 2216 is locked with at least PCLK[i] 2212 and PCLK[j] 2214. The "temporal distance" is a delay in a number of cycles with respect to a certain clock, such as either PCLK[i] 2212 or PCLK[j] 2214. As such, an ATP Generator can calculate a temporal distance by counting the number of falling edges of PCLK[i] 2212 starting from reference clock edge 2220 to a designated launch (or capture) clock edge. The ATP Generator can form test patterns based on temporal distances. Then, an ATE can program temporal distances into clock pulse controllers of PTCCs as well as sting generators to provide multi-cycle testing.

Diagram 2230 of FIG. 22A shows calculated temporal distances 2232 and 2234 for launching a transition from clock domain [i] and capturing it at clock domain [j]. So an input transition can be launched at the 5th rising edge 2217 of PCLK[i] 2212—after a delay of 4 falling edges (e.g., a temporal distance 2232 of 4)—from a rising edge 2220 of RefClk [k] 2216. The transition is captured at the 2nd rising edge 2219 of clock PCLK[j] 2214, after a delay of 1 falling edge (e.g., a temporal distance 2234 of 1). Diagram 2240 shows calculated temporal distances 2242 and 2244 for capturing a transition into clock domain [i] from clock domain [j], which launches the transition (reverse direction than for diagram 2230). As such, a transition can be launched at the 2nd rising edge 2219 of PCLK[j] 2214 (e.g., after a temporal distance 2244 of 1) and the transition can be captured at the 7th rising edge 2221 of PCLK[i] 2212, after a delay of 6 falling edges (e.g., a temporal distance 2242 of 6).

FIG. 22B illustrates the calculation of temporal distances in cases where neither reference clocks nor test clocks are in phase. This figure depicts the timing for an inter-clock domain test in which clock domains correspond to functional clocks that are not in phase and are not synchronized. In this example, clocks PCLK[i] 2262 and PCLK[j] 2264 are derived from reference clocks RefClk[k] 2266 and RefClk[l] 2268, respectively, which are asynchronous. As such, temporal distance calculations are in terms of multiple timing reference points. For example, reference points 2267 and 2269 provide different bases from which to determine temporal distances.

Diagram 2280 of FIG. 22B shows calculated temporal distances 2282 and 2284 for launching a transition from clock domain [i] and capturing it at clock domain [j], respectively. So an input transition can be launched at the 5th rising edge 2277 of PCLK[i] 2262—after a delay of 4 falling edges (e.g., a temporal distance 2282 of 4)—from a rising edge 2267 of RefClk[k] 2266. The transition is captured at 2nd rising edge 2279 of clock PCLK[j] 2264, after a delay of 1 falling edge (e.g., a temporal distance 2284 of 1). Diagram 2290 shows calculated temporal distances 2292 and 2294 for capturing a transition into clock domain [i] from clock domain [j], which launches the transition. As such, a transition can be launched at the 2nd rising edge 2279 of PCLK[j] 2264 (e.g., after a temporal distance 2294 of 1) and the transition can be captured at the 8th rising edge 2281 of PCLK[i] 2262, after a delay of 7 falling edges (e.g., a temporal distance 2292 of 7). In some embodiments, multiple SeC signals 2270 can be incorporated to allow flexible implementation of the inter-clock domain test. Multiple SeC signals 2270 (not shown) can increase controllability of edge selection for the reference clocks, thereby reducing the size of one or more string generators by selecting desired starting edges of reference clocks. For example, a SeC[m] signal and SeC[m+1] signal, for example, can select starting edge to be falling or rising edge of (t)th period and (t+h)th for minimizing the size of string generators.

Figure 23:
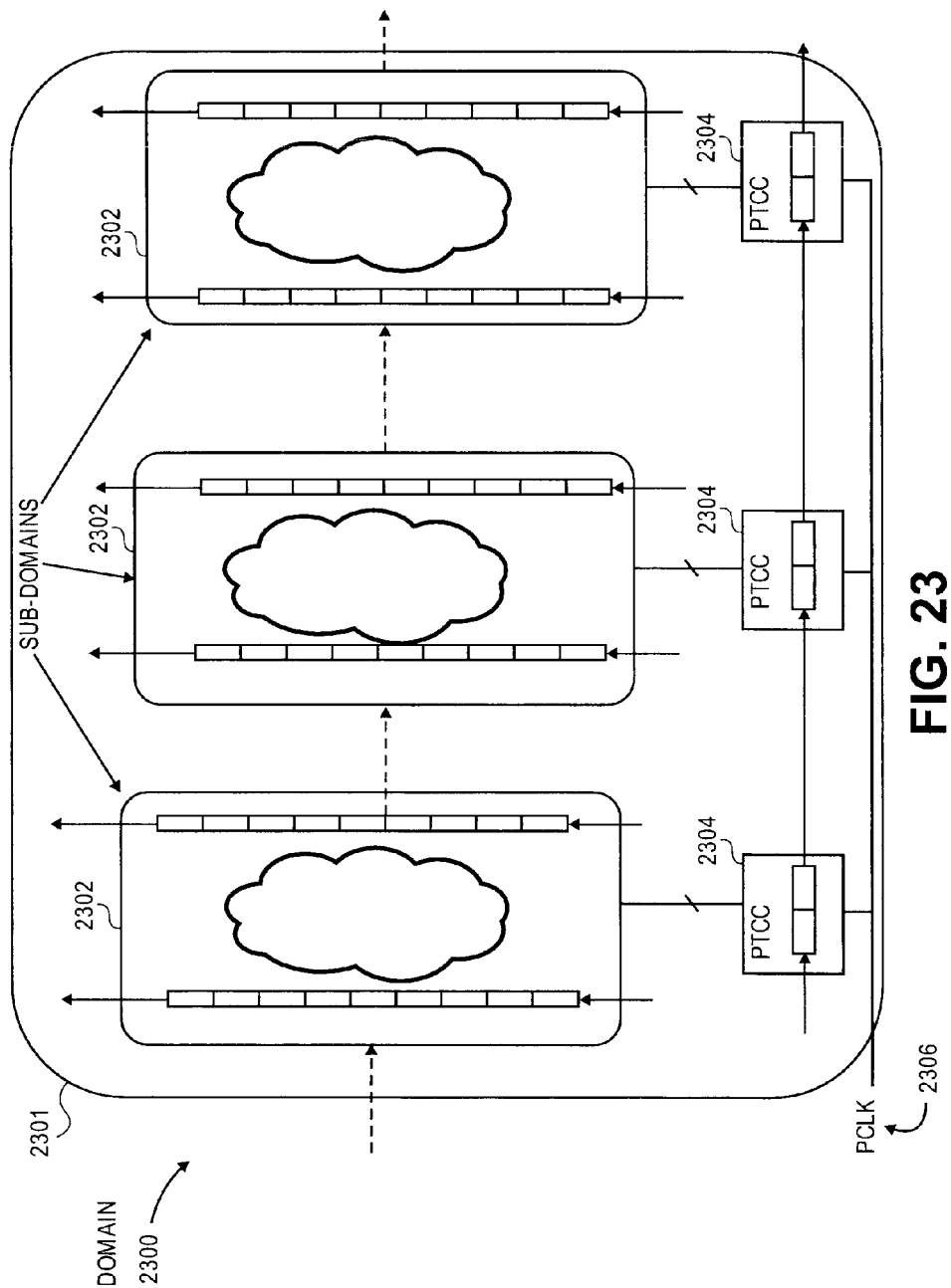
FIG. 23 illustrates a test clock control structure configured to perform intra-domain testing, according to one embodiment of the invention.

FIG. 23 illustrates a test clock control structure configured to perform intra-domain testing, according to one embodiment of the invention. Test clock control structure 2300 includes programmable test clock controller ("PTCC") 2304 each for controlling a corresponding sub-domain 2302. Domain 2301 is partitioned into a number of smaller domains, or sub-domains 2302. If domain 2301 is a clock domain, PTCCs 2304 collectively use a common functional clock PCLK 2306 for testing sub-domains 2302 as sub-clock "clock" domains.

Figure 24:
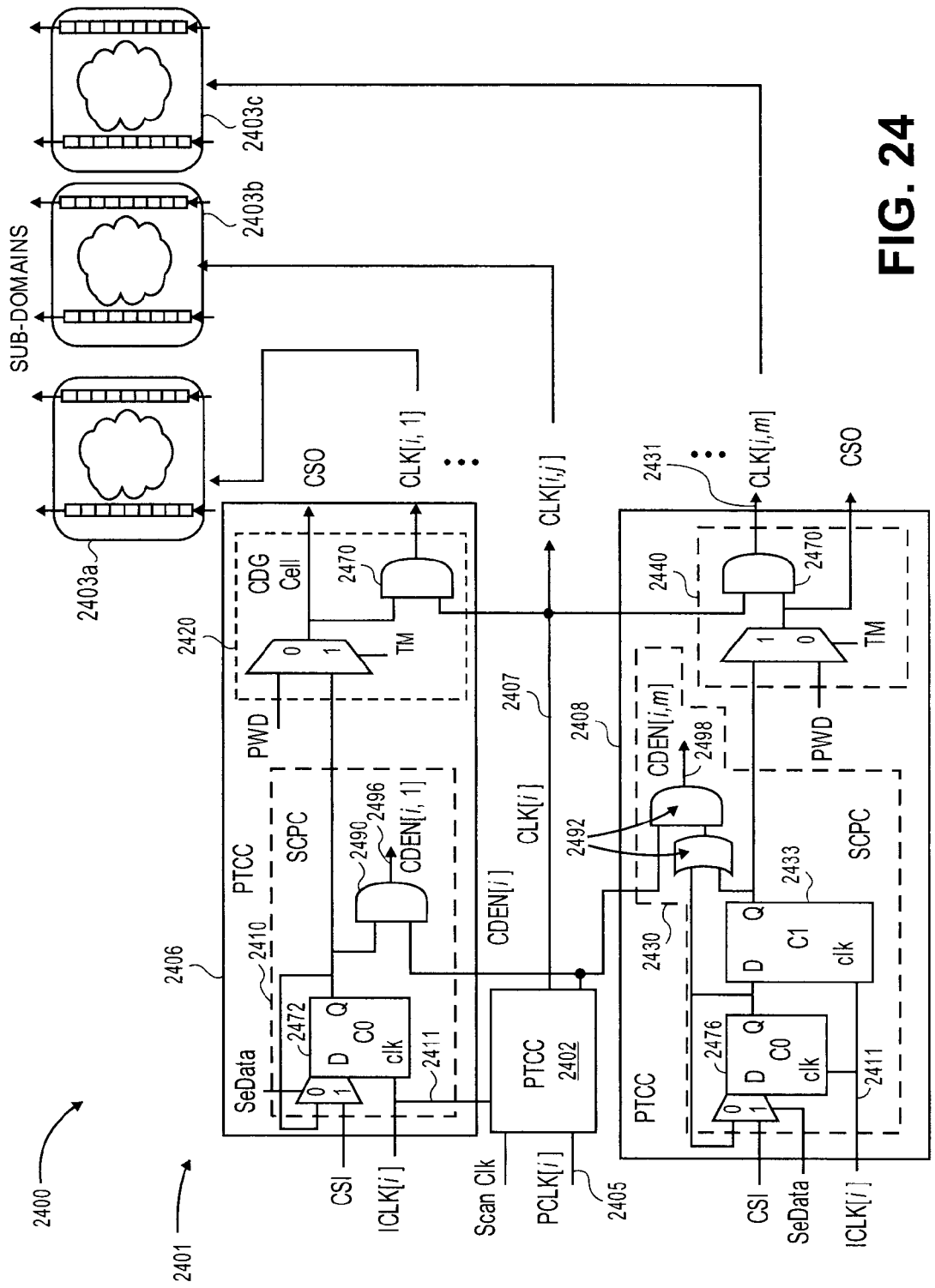
FIG. 24 illustrates a test clock control structure configured to perform intra-domain testing using simplified programmable test clock controllers, according to one embodiment of the invention.

FIG. 24 illustrates a test clock control structure configured to perform intra-domain testing using simplified programmable test clock controllers, according to one embodiment of the invention. In this example, test clock control structure 2400 includes an arrangement 2401 of simplified programmable test clock controllers for controlling scan testing of multiple sub-clock domains 2403. As used herein, the term "clock domain generalization" in some embodiments refers to the process of partitioning a clock domain into a set of sub-clock domains 2403, whereby arrangement 2401 of simplified programmable test clock controllers can more flexibility with the generalized clock domain than with a structure for a pre-partitioned original clock domain. For example, arrangement 2401 of simplified programmable test clock controllers can also be useful when power domains embedded in a circuit can be divided into and tested as sub-domains 2403. Since the performance of power circuitry can affect system delay within a power domain, it may be desirable to form each power domain as a separate sub-domain 2403 and control it independently during delay testing. Note that clock domain generalization can also be useful in silicon debug to detect, for example, a failing flip-flop in a sub-clock domain without interfering with the testing of other sub-clock domains. Since arrangement 2401 allows a user to program scan load/unload in any clock domain, only select scan chains in the clock domains that contain sub-clock domains 2403 need be loaded/unloaded during diagnosis.

Arrangement 2401 is configured to drive "m" number of sub-clock domains 2403 using a functional clock PCLK[i] 2405. Arrangement 2401 includes a parent PTCC 2402 and children PTCCs 2406 and 2408. Parent PTCC 2402 operates to broadcast a programmable number of test clock pulses 2407 to children PTCCs 2406 and 2408, either of which can be programmed to either use test clock pulses 2407 or not. While PTCCs 2406 and 2408 can have the same structure and/or functionality as parent PTCC 2402, they are composed of simplified programmable test clock controllers ("SPTCCs") in this example. Advantageously, PTCCs 2406 and 2408, as SPTCCs, require less hardware resources to implement. As shown, an SPTCC includes a simplified clock pulse controller ("SCPC") and a clock domain generalization ("CDG") cell. Here, PTCC 2406 includes SCPC 2410 and CDG cell 2420, whereas PTCC 2408 includes SCPC 2430 and CDG cell 2440. In some embodiments, SCPC 2430 and CDG cell 2440 can be described as simplified versions of the CPC and TCG (neither are shown), respectively, of parent PTCC 2402. In operation, the outputs of SCPC 2410 and SCPC 2430 are AND-ed with test clock pulses 2407 at gates 2470 to produce the sub-domain clocks CLK[i,1], CLK[i, j], up through CLK[i,m], for example. Note that disabling parent PTCC 2402 results in disabling all sub-clock domains. Note also that gate 2490 and gates 2492 generate clock domain enable signals ("CEDN[i,1]") 2496 and ("CEDN[i,m]") 2498 to respectively enable operation of clock domains 2403a and 2403c.

Further note that the structure of an SPTCC can be optimized for certain test requirements of each sub-clock domains. For example, if test clock pulses 2407 are to be either passed or blocked, the SPTCC can include SCPC 2410, which includes a single flip-flop ("C0") 2472 to control clock CLK[i,1]. In this case, SCPC 2410 can be loaded using ICLK[i] 2411 and left unchanged during launch and/or capture operations. In some embodiments, ICLK[i] 2411 can be generated using the signals CPCen 1240, PCLK 1252, and TCLK 1210, as shown in FIG. 12. For launch and/or capture operations, SCPC 2410 can be loaded with a logical value of 1 (e.g., loaded into element ("C0") 2472) along with the parent CPC (not shown) in parent PTCC 2402, which is loaded with a control pattern to generate CLK[i] (e.g., from a string generator or the like). If a local test clock CLK[i,j] is the same as parent test clock CLK[i] 2407, PTCCs 2406 and 2408 are enabled. If a test of sub-clock domains 2403 requires, for example, to perform either a delayed launch-only or capture-only in different clock cycles, an SPTCC can include SCPC 2430, which has a 2-bit local shift register (similar to parent PTCC 2402) composed of elements ("C0") 2476 and ("C1") 2433. Advantageously, a 2-bit implementation of an SCPC, such as SCPC 2430, facilitates test time and test volume reduction.

Figure 25A:
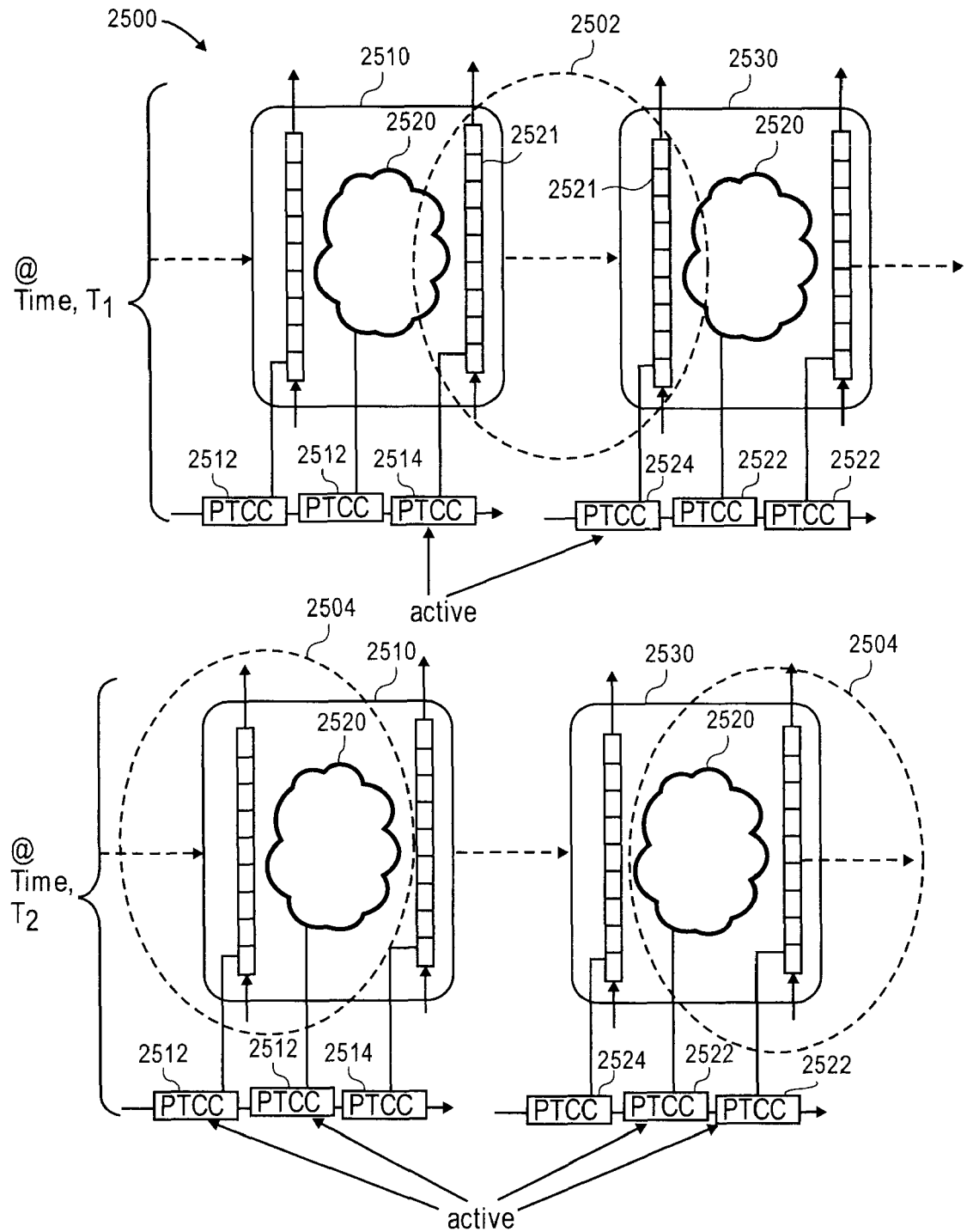
FIGS. 25A to 25D illustrate test clock control structures configured to facilitate inter-domain testing and intra-domain testing using programmable test clock controllers, according to one embodiment of the invention.

FIGS. 25A to 25D illustrate test clock control structures configured to facilitate inter-domain testing and intra-domain testing using programmable test clock controllers, according to one embodiment of the invention. In FIG. 25A, test clock control structure 2500 facilitates either inter-domain testing or intra-domain testing, or both, of circuits—regardless of whether portions of domains or sub-domains 2510 and 2530 are exercised in parallel or in series to test circuits 2520. As programmable test clock controllers can be programmed to confine the internal interactions of domains within the boundaries of each clock domain, the interfaces for a domain can be controlled independently from the rest of domain. Consequently, one or more domain interfaces (and sub-domain interfaces) can be implemented in scan-based testing in parallel or in series with the testing of other portions of the domain (or sub-domain). Accordingly, individual PTCCs can be used to control select portions of a sub-domain, such as a scan chain portion, a circuit, and the like.

To illustrate, consider that PTCCs 2512 and 2514 for sub-domain 2510 each operate with the same functional clock, which as a different clock rate than the functional clock used by PTCCs 2522 and 2524 for sub-domain 2530. First consider that PTCCs 2514 and 2524 are programmed to activate a portion 2502 of test clock control structure 2500 at some time, T1. For example, PTCCs 2514 and 2524 can be programmed to perform a launch and capture operation, or some other operation, such as a scan chain load or unload operation. As such portion 2502 can be controlled independently from other portions of clock control structure 2500. Further to this example, consider that PTCCs 2512 and 2522 can be programmed to perform intra-domain (or intra-sub-domain) dynamic and/or static testing in parallel, or in series, with the testing of portion 2502. Next, consider that at time, T2, PTCCs 2514 and 2524 can be disabled, while the other PTCCs are enabled to engage in dynamic (e.g., broadside, last-shift-launch, inter-domain, intra-domain, etc.) and/or static testing to test portions 2504. Note that in some embodiments, test clock control structure 2500 and attendant circuitry generally define a structure composed of PTCCs 2512, 2514, 2522 and 2524.

Figure 25B:
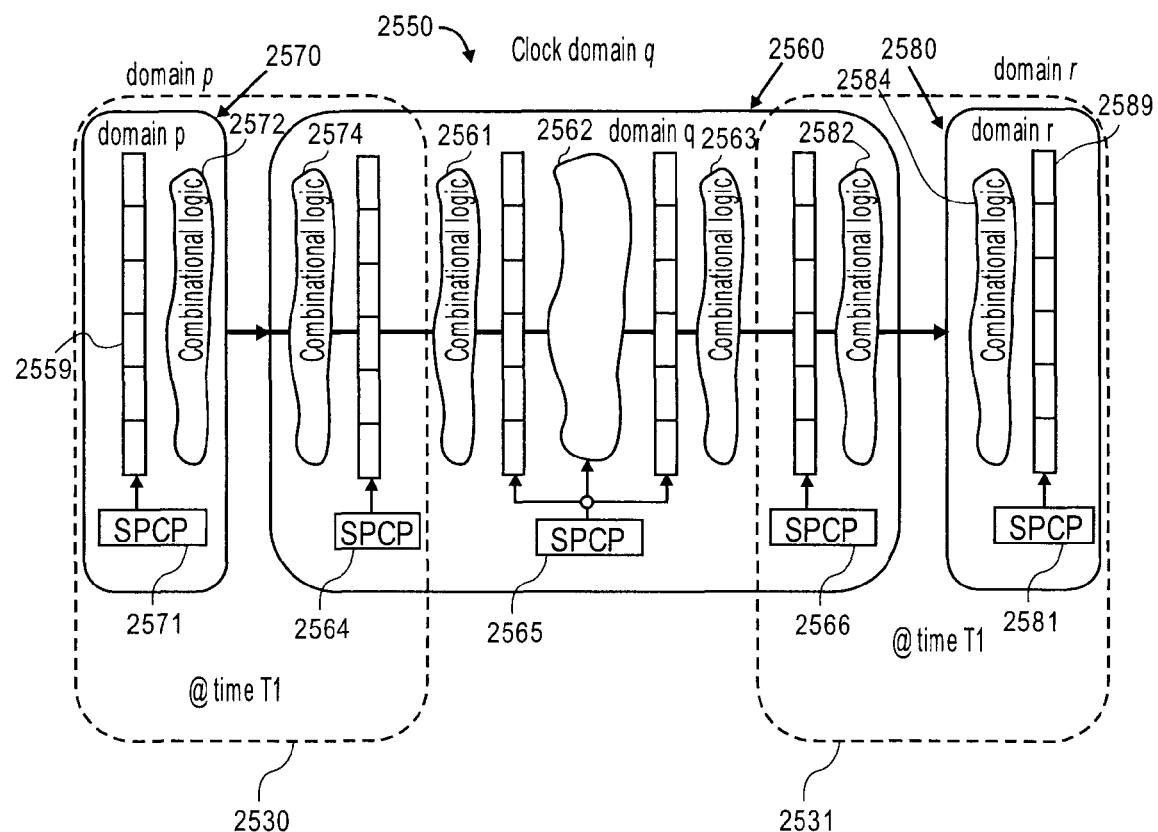
Figure 25C:
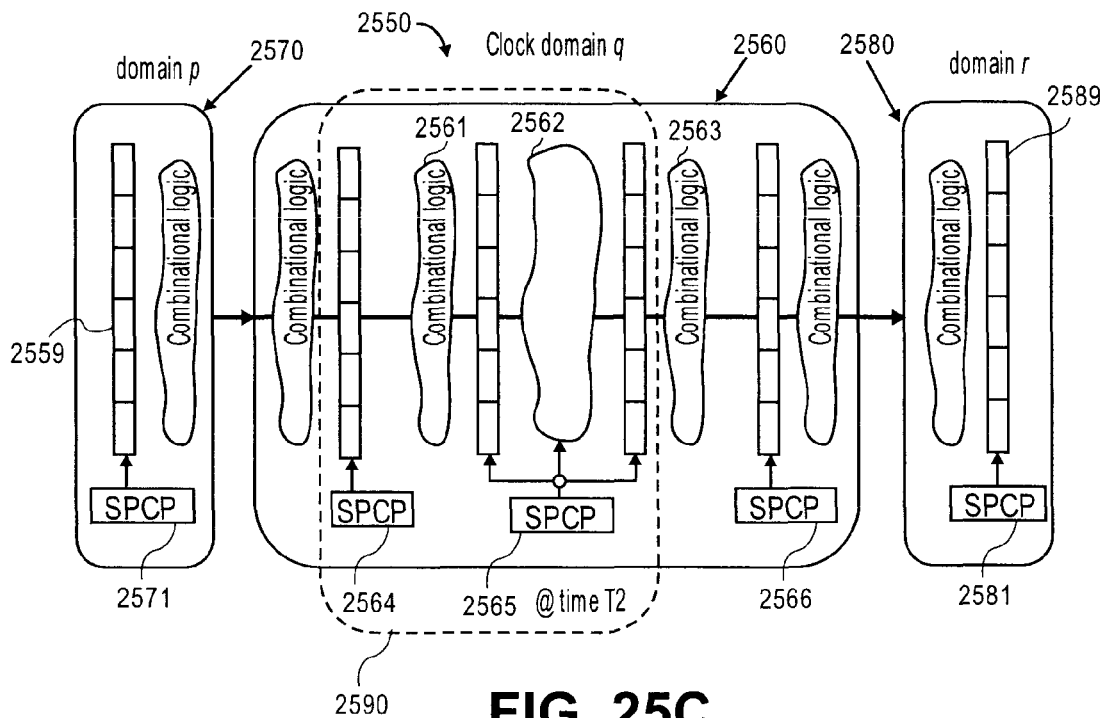
Figure 25D:
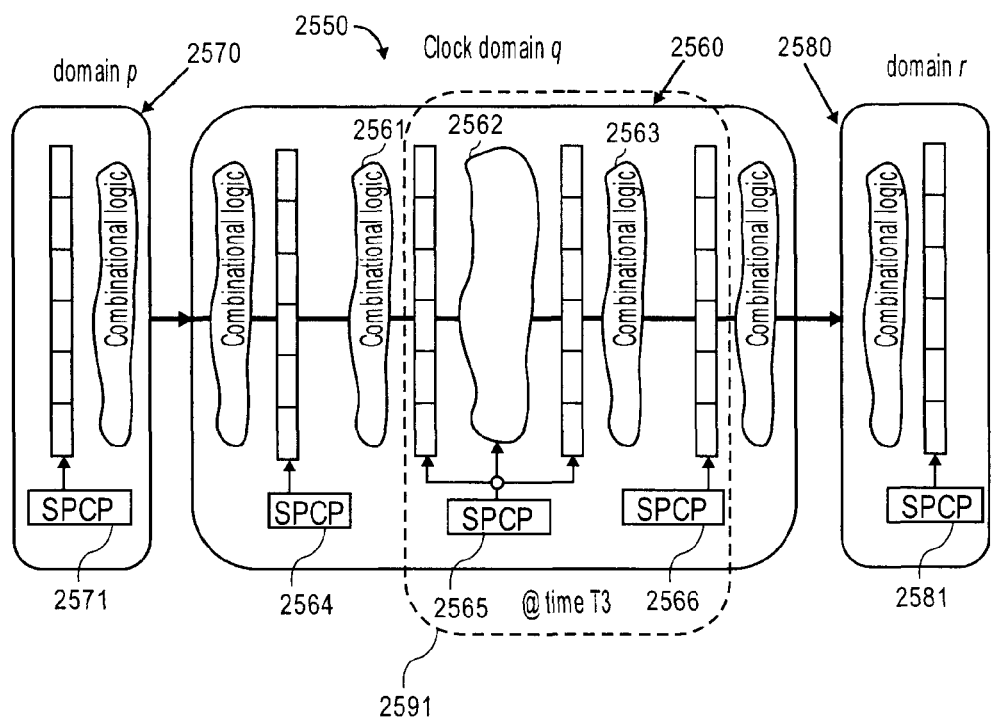

FIGS. 25B to 25D illustrate yet another example of a test clock control structure configured to facilitate inter-domain testing and intra-domain testing using programmable test clock controllers, according to another embodiment of the invention. Test clock control structure 2550 facilitates either inter-domain testing or intra-domain testing, or both. As programmable test clock controllers can be programmed to confine the internal interactions within the boundaries of each clock domain, the interfaces for a domain can be controlled independently from the rest of domain. Examples of such interfaces include input registers and/or output registers. Consequently, one or more domain interfaces (and sub-domain interfaces) can be implemented in scan-based testing in parallel and/or in series with the testing of other portions of the domain (or sub-domain). Accordingly, individual SPCPs can be used to control select portions of a sub-domain, such as a scan chain portion, a circuit, or the like.

For example, FIG. 25B shows that SPCPs 2564 and 2566 for sub-domain 2560 each operate with the same functional clock, both of which can have a different clock rate than the functional clock used by SPCPs 2571 and 2581 for sub-domains 2520 and 2580, respectively. First, consider that SPCPs 2571 and 2564 are programmed to activate inter-clock domain testing to test logic 2572 and/or logic 2474 in circuit portion 2530, whereas SPCPs 2566 and 2581 are programmed to activate inter-clock domain testing to test logic 2582 and/or logic 2584 in circuit portion 2531. All SPCPs 2571, 2564, 2566 and 2581 can be programmed to operate at some time, T1. Note that register 2559 can represent an output register for sub-domain ("domain r") 2580. Therefore, SPCPs 2571 and 2564 can be programmed to perform, for example, a launch (e.g., from sub-domain 2570) and capture operation (e.g., into sub-domain ("domain q") 2560) respectively, or some other operation, such as a scan chain load or unload operation. Note that register 2589 can represent an input register for sub-domain ("domain p") 2570. Similarly, SPCPs 2566 and 2581 can be programmed to perform, for example, a launch (e.g., from sub-domain ("domain q") 2560) and capture operation (e.g., into sub-domain ("domain r") 2580) respectively, or some other operation, such as a scan chain load or unload operation. As such circuit portions 2530 and 2531 can be controlled independently from other portions of clock control structure 2550 (e.g., independent of logic 2561, logic 2562 and logic 2563 of sub-domain 2560). Further to this example, consider that SPCPs 2564, 2565 and 2566 can be programmed to perform intra-domain (or intra-sub-domain) dynamic and/or static testing in parallel, or in series, with the testing of portion circuit portions 2530 and 2531 of FIG. 25B. FIG. 25C shows that at time, T2, SPCPs 2571 and 2581 can be disabled (e.g., to preserve the contents of registers 2559 and 2589), while the SPCPs 2564 and 2565 are configured to engage in dynamic (e.g., broadside, last-shift-launch, inter-domain, intra-domain testing, etc.) and/or static testing to test circuit portion 2590, which includes portion of system combinational logic 2561, and another portion 2562 that can contain internal registers and logic. Similarly, FIG. 25D shows that at time, T3, SPCPs 2565 and 2566 can be enabled to engage in dynamic and static tests, in order to test circuit portion 2591, which includes other portion 2562 of circuitry and logic 2563.

FIG. 26 shows an example of a micro-level flow for using test clock controller structure implementing programmable test clock controllers ("PTCCs") to test circuits in accordance with an embodiment of the present invention. Flow 2600 applies generally to PTCCs with 2-bit shift registers and without a supplemental clock command source. In some cases, SeFFs are initialized before scan load/unload operations commence in flow 2600. Examples of SeFFs are referenced as SeFFs 1860 in FIG. 18. Flow 2600 begins by enabling scan test mode ("TM") by asserting a test mode activation signal at 2601. At 2602, a control load/unload operation is initialized to access a control chain. Then, the PTCC is programmed at 2604 to either enable or disable the propagation of a test clock as a scan clock, SCLK. Next, a scan load/unload operation begins at 2606 when the scan path is enabled. At 2608, scan data is loaded into or unloaded from a scan chain portion, after which the PTCC enters program mode at 2610. Optionally, SeFFs can be initialized by applying one SCLK clock pulse to all SeFFs prior to 2612. Once in program mode, the PTCC can be configured in accordance with the clock command information loaded into it at 2612. For example, the PTCC can be configured to engage in one or more of: a launch and/or capture operation, a launch-only operation, a capture-only operation, a silent operation, or the like. At 2614, the PTCC can enter silent state operation. Optionally, it can perform a static test, such as an IDDQ leakage test. If so, an ATE can apply (or force) an input at 2618, followed by a parametric IDDQ measurement at power supply and ground terminals. Next, the PTCC enters a functional test mode at 2620 to perform dynamic testing associated with a launch and/or a capture. The PTCC carries out a programmed launch or/and capture at 2622. At 2624, an ATE, for example, determines whether all domains have been tested, and if not, what the next course of action ought to be. If one or more additional clock domains require testing, flow 2600 continues to 2612 if the PTCC can be programmed to change its functionality to further test a circuit without an accompanying scan load/unload operation. But if a scan load/unload operation is required, then flow 2600 continues to 2604. At 2630, the ATE continues testing until the patterns have been implemented.

While flow 2600 sets forth two programming steps for the PTCC using a control chain, the test time and test data volume associated with operations at 2604 and 2610 are significantly less of an impact to total test time and data volume relative to scan load and unload operation. Further, entire clock domains do not need to engage in scan load and unload operations until the clock domains are exercised. Generally, the test clock control structure is designed to perform scan load and unload operations on scan chains only in the exercised clock domains. Advantageously, flow 2600 provided for a reduction in total test time relative to conventional scan-based testing, which more frequently load and unloads scan chains.

While flow 2600 describes an example of how to use a test clock control structure for implementing tests on a per-configuration or set-up level, other embodiments of the invention are direct to a macro-level test flow using the test clock control structures set forth herein. In accordance with one embodiment, a method for implementing a test clock control structure for scan-based testing can be described as follows. The method can perform an intra-domain test to exercise a first subset of domains of the plurality of circuits implementing dynamic fault detection test patterns. The method continues to further perform another test, such as an inter-domain test for exercising a second subset of domains of the plurality of circuits implementing dynamic fault detection test patterns. These dynamic fault detection test patterns can include last-shift-launch test patterns and broadside test patterns, as well as any other dynamic test patterns. In some embodiments, these domains are clock domains. In some cases, the method further includes performing intra-domain testing, such as stuck-at tests and dynamic tests, on portions of circuits that are isolated from the circuits undergoing inter-domain testing.

Next, the method can configure different programmable test clock controllers to test different clock domains substantially in parallel. Generally, this reduces the number of times one or more scan chains are loaded when testing the different clock domains. Note that the programmable test clock controllers can include different sub-clock domains to test the different sub-clock domains. In some embodiments, the performance of the intra-domain testing can be interleaved with that of inter-clock domain testing, which can be implemented with stuck-at tests. For example, an intra and an inter-clock domain test pattern can be combined into a single test pattern, thereby advantageously increasing test coverage per scan chain operation. Note that the intra-clock domain test can be performed followed by inter-domain test. The performance of the inter-domain testing can also include implementing static fault detection test patterns. For example, the fault detection test patterns can be loaded into scan chains substantially concurrent with the dynamic fault detection test patterns used for inter-domain testing. The ATE also can execute a last-shift-launch test substantially concurrent with static fault testing during the inter-domain testing.

In some embodiments, the performance of inter-domain testing for the method includes calculating a temporal distance, and initiating a launch and capture sequence between two domains based on the temporal distance. In at least one embodiment, the method includes generating the dynamic fault detection test patterns in accordance with an automatic test pattern generation ("ATPG") flow for a specific test clock control structure including one or more control chains and one or more scan chains. An example of an ATPG flow is described next.

FIG. 27 shows an example of a macro-level flow for using test clock controller structure implementing programmable test clock controllers ("PTCCs") to test circuits in accordance with an embodiment of the present invention. Specifically, flow 2700 is an ATPG flow for generating test patterns for implementing test clock control structures. In flow 2700, the intra and inter-clock domain tests are separated to reduce number of scan load/unload operations. Within intra and inter-clock domain tests, the at-speed test for last-shift-launch testing is carried out first with a broadside following. This positioning of last-shift-launch before broadside attempts to optimize overall test coverage, test data volume and ATPG runtime. Further, test patterns can be obtained by appending the delay test patterns using broadside to the patterns using last-shift-launch. Note that the ATPG in flow 2700 for stuck-at tests can be implemented in the inter-clock domain testing. This is because, stuck-at test patterns included in the delay test patterns have virtually no effect during delay test, but they can reduce the number of stuck-at test patterns to be generated.

As such, flow 2700 begins automatic test pattern generation by generating patterns to implement delay tests for intra-clock domain logic at 2710. This can include generating test patterns for delay faults using last-shift-launch at 2720, and generating test patterns for undetected faults in 2720 using broadside at 2730. Note that in some embodiments, inter-clock domain test patterns can be included in test pattern generation at 2722 for last-shift-launch testing, as well as in test pattern generation at 2732 for broad-aside testing. Flow 2700 continues to 2740 at which the flow generates delay test patterns for inter-clock domain logic. At 2750, the ATPG flow generates test patterns for delay faults using last-shift-launch, followed by the generation of test patterns at 2760 for undetected faults at 2750 using broadside. For example, delay test pattern generation using last-shift-launch in some cases can be followed by the same test using broadside test protocol in order to detect faults that escaped from the test using last-shift-launch. In some embodiments, stuck-at patterns for testing intra-clock domain logic can be included in test pattern generation at 2752 for last-shift-launch testing, as well as in test pattern generation at 2762 for broad-aside testing. As such, flow 2700 can generate stuck-at test patterns for performing static tests in parallel with dynamic tests. At 2780, the ATPG flow can perform fault simulation for test patterns generated between 2710 and 2740 to detect stuck-at faults. This is followed by the generation of test patterns for undetected stuck-at faults in step 3 at 2780. This includes generating test patterns for intra-clock domain logic at 2792 and inter-clock domain logic at 2794. Executing stuck-at test patterns at functional speed can enhance the quality of testing as well as simplify the test process because the stuck-at test protocol need not be considered. At 2796, flow 2700 integrates the stuck-at test patterns generated at 2792 with the delay test patterns generated at 2720. At 2798, flow 2700 continues by integrating the stuck-at test patterns generated at 2794 with the delay test patterns generated at 2750. At 2799, the resulting broad-aside test patterns can be appended to the last-shift-launch patterns to form the final test patterns.

An embodiment of the present invention relates to a computer storage product with a computer-readable medium having computer code thereon for performing various computer-implemented operations. The media and computer code may be those specially designed and constructed for the purposes of the invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits ("ASICs"), programmable logic devices ("PLDs") and ROM and RAM devices. Examples of computer code include machine code, such as produced by a compiler, and files containing higher-level code that are executed by a computer using an interpreter. For example, an embodiment of the invention can be implemented using Java, C++, or other object-oriented programming language and development tools. Another embodiment of the invention can be implemented in hardwired circuitry in place of, or in combination with, machine-executable software instructions.

The foregoing description, for purposes of explanation, used specific nomenclature to provide a thorough understanding of the invention. However, it will be apparent to one skilled in the art that specific details are not required in order to practice the invention. In fact, this description should not be read to limit any feature or aspect of the invention to any embodiment; rather features and aspects of one embodiment may readily be interchanged with other embodiments. For example, while inter-domain and intra-domain testing have been described generally in terms of clock domains, an ordinarily skilled artisan should appreciate that those tests can apply to any other type of domains, such as power domains.

Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications; they thereby enable others skilled in the art to best utilize the invention and various embodiments with various modifications as are suited to the particular use contemplated. Notably, not every benefit described herein need be realized by each embodiment of the invention; rather any specific embodiment can provide one or more of the advantages discussed above. It is intended that the following claims and their equivalents define the scope of the invention.

The invention claimed is:

1. A method for scan-based testing of a plurality of circuits using a test clock control structure comprising:
    performing with a first programmable test clock controller of the test clock control structure an intra-domain test in a first subset of clock domains of the plurality of circuits, the intra-domain test including shifting a first dynamic fault detection test pattern in a first scan chain portion, the shifting in the first scan chain portion being done according to a first portion of control information shifted in a first control chain;
    performing with a second programmable test clock controller of the test clock control structure an inter-domain test in a second subset of clock domains of the plurality of circuits from a first clock domain to a second clock domain, the inter-domain test including shifting a second dynamic fault detection test pattern in a second scan chain portion in parallel with the shifting of the first dynamic fault detection test pattern in the first scan chain portion, the shifting in the second scan chain portion being done according to a second portion of control information shifted in a second control chain; and
    generating a first clock rate for the first clock domain and a second clock rate for the second clock domain, the first clock rate and the second clock rate being generated using a common functional clock to establish a timing reference point for the inter-domain test;
    wherein the first dynamic fault detection test pattern and the second dynamic fault detection test pattern include a last-shift-launch test pattern and a broadside test pattern, and wherein the first programmable test clock controller and the second programmable test clock controller shift, respectively, the first portion of control information and the second portion of control information.

2. The method of claim 1 further comprising configuring different programmable test clock controllers to test different clock domains in parallel.

3. The method of claim 2 wherein testing the different clock domains in parallel further comprises testing a plurality of different clock domains without reloading a scan chain.

4. The method of claim 2 wherein the programmable test clock controllers to be configured for different sub-clock domains to test the different sub-clock domains are simplified programmable test clock controllers that include a clock pulse controller and a clock domain generalization cell.

5. The method of claim 1 wherein performing the intra-domain and inter-domain tests includes:
    loading dynamic fault detection test patterns concurrently with a loading of static fault detection test patterns; and
    executing a dynamic test using the dynamic fault detection test patterns concurrently with static fault testing.

6. The method of claim 1 wherein performing the intra-domain testing further comprises:
    loading intra-clock domain test patterns into scan chains concurrently with loading of inter-clock domain test patterns; and
    executing an intra-clock domain test and an inter-clock domain test during the intra-domain testing without reloading the scan chain.

7. The method of claim 1 wherein performing the inter-domain testing further comprises:
    loading inter-clock domain test patterns into scan chains concurrently with intra-clock domain test patterns; and
    executing an inter-clock domain test and an intra-clock domain test during the inter-domain testing without reloading the scan chain.

8. The method of claim 1 wherein performing the inter-domain testing and inter-domain testing further comprises performing intra-domain testing on a first portion of the plurality of circuits and performing the inter-domain testing on a second portion of the plurality of circuits, the first portion being isolated from the second portion.

9. The method of claim 1 wherein performing the inter-domain testing further comprises:
    calculating a temporal distance based on the timing reference point for the inter-domain test; and
    initiating a launch and capture sequence between the first clock domain and the second clock domain based on the temporal distance.

10. The method of claim 1, further comprising:
    configuring the first programmable test clock controller and the second programmable test clock controller to load the first scan chain and the second scan chain; and
    loading scan data into the first scan chain in accordance with a first set of clock command information, the first set of clock command information specifying whether to enable loading of the first scan chain.

11. A computer readable medium for implementing a test clock control structure to effect scan-based testing of a plurality of circuits using a clock test control structure, the computer readable medium having stored thereon data representing executable instructions that, when executed by a processor, cause the processor to perform operations comprising:
    performing with a first programmable test clock controller of the test clock control structure an intra-domain test in a first subset of clock domains of the plurality of circuits, the intra-domain test including shifting a first dynamic fault detection test pattern in a first scan chain portion, the shifting in the first scan chain being done according to a first portion of control information shifted in a first control chain;
    performing with a second programmable test clock controller of the test clock control structure an inter-domain test in a second subset of clock domains of the plurality of circuits from a first clock domain to a second clock domain, the inter-domain test including shifting a second dynamic fault detection test pattern in a second scan chain portion in parallel with the shifting of the first dynamic fault detection test pattern in the first scan chain portion, the shifting in the second scan chain being according to a second portion of control information shifted in a second control chain; and generating a first clock rate for the first clock domain and a second clock rate for the second clock domain, the first clock rate and the second clock rate being generated using a common functional clock to establish a timing reference point for the inter-domain test;

wherein the first dynamic fault detection test pattern and the second dynamic fault detection test pattern include a last-shift-launch test pattern and a broadside test pattern, and wherein the first programmable test clock controller and the second programmable test clock controller shift, respectively, the first portion of control information and the second portion of control information.

12. The method of claim 10, further comprising receiving a first signal to control multiplexing between a scan path and a functional path for the test clock control structure and a second signal to control multiplexing between a scan clock and the common functional clock.

13. The method of claim 12, wherein the first control chain and the first scan chain portion share a primary input and a primary output.

14. The method of claim 10, wherein the first programmable test clock controller includes an interface with the first control chain and an interface with the first scan chain, the first control chain being a separate channel from the first scan chain.

15. The method of claim 1, further comprising the first programmable test clock controller generating a respective first test clock signal based on the shifting the first portion of control information, and the second programmable test clock controller generating a second test clock signal based on the shifting the second portion of control information.

16. The medium of claim 11 further comprising data representing executable instructions that, when executed by a processor, cause the processor to perform operations comprising:

configuring different programmable test clock controllers to test different clock domains in parallel.

17. The medium of claim 16, wherein testing the different clock domains in parallel further comprises testing a plurality of different clock domains without reloading a scan chain.

18. The medium of claim 16, wherein the different programmable test clock controllers include a simplified programmable test clock controller having a clock pulse controller and a clock domain generalization cell.

19. The medium of claim 11, wherein performing the intra-domain and inter-domain tests includes:
  loading dynamic fault detection test patterns concurrently with a loading of static fault detection test patterns; and
  executing a dynamic test using the dynamic fault detection test patterns concurrently with static fault testing.

20. The medium of claim 11, wherein performing the intra-domain testing further comprises:
  loading intra-clock domain test patterns into scan chains concurrently with loading of inter-clock domain test patterns; and
  executing an intra-clock domain test and an inter-clock domain test during the intra-domain testing without reloading the scan chain.

21. The medium of claim 11, wherein performing the inter-domain testing further comprises:
  loading inter-clock domain test patterns into scan chains concurrently with intra-clock domain test patterns; and
  executing an inter-clock domain test and an intra-clock domain test during the inter-domain testing without reloading the scan chain.

22. The medium of claim 11, wherein performing the inter-domain testing and inter-domain testing further comprises performing intra-domain testing on a first portion of the plurality of circuits and performing the inter-domain testing on a second portion of the plurality of circuits, the first portion of the plurality of circuits not overlapping with the second portion of the plurality of circuits.

23. The medium of claim 11, wherein performing the inter-domain testing further comprises:
  calculating a temporal distance based on the timing reference point for the inter-domain test; and
  initiating a launch and capture sequence between the first clock domain and the second clock domain based on the temporal distance.

* * * * *